(12) United States Patent
Lee et al.

(10) Patent No.: US 11,925,094 B2
(45) Date of Patent: Mar. 5, 2024

(54) DISPLAY DEVICE

(71) Applicant: Samsung Display Co., Ltd., Yongin-si (KR)

(72) Inventors: Hyeon Bum Lee, Hwaseong-si (KR); Won Hak Choi, Seoul (KR); Kang Wook Heo, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/444,453

(22) Filed: Aug. 4, 2021

(65) Prior Publication Data

US 2022/0199699 A1    Jun. 23, 2022

(30) Foreign Application Priority Data

Dec. 21, 2020 (KR) .......................... 10-2020-0179717

(51) Int. Cl.
| | | |
|---|---|---|
| *G06F 3/041* | (2006.01) | |
| *G06F 3/044* | (2006.01) | |
| *H10K 50/842* | (2023.01) | |
| *H10K 50/86* | (2023.01) | |
| *H10K 59/38* | (2023.01) | |
| *H10K 59/40* | (2023.01) | |

(52) U.S. Cl.
CPC .......... *H10K 59/40* (2023.02); *G06F 3/0412* (2013.01); *G06F 3/0443* (2019.05); *H10K 50/8426* (2023.02); *H10K 50/865* (2023.02); *H10K 59/38* (2023.02)

(58) Field of Classification Search
None
See application file for complete search history.

(56) References Cited

U.S. PATENT DOCUMENTS

2017/0003429 A1* 1/2017 Kanatani ............... G02B 5/3083
2017/0003775 A1* 1/2017 Hu ........................ G06F 3/04166
2019/0252475 A1* 8/2019 Sung .................... H01L 27/3225

FOREIGN PATENT DOCUMENTS

| CN | 111370446 A | 7/2020 | |
|---|---|---|---|
| EP | 2765627 A2 * | 8/2014 | ......... H01L 27/3223 |
| KR | 10-2018-0076689 A | 7/2018 | |
| KR | 10-2020-0026381 A | 3/2020 | |

(Continued)

OTHER PUBLICATIONS

Translation of KR 10-2020-0026381 A into English; Sung et al. (Year: 2020).*

*Primary Examiner* — Brian M Butcher
(74) *Attorney, Agent, or Firm* — Lewis Roca Rothgerber Christie LLP

(57) ABSTRACT

Some embodiments provide a display device including a substrate having an opening area, a peripheral area surrounding the opening area, and a display area surrounding the peripheral area, a transistor and a light emitting element on the substrate, an encapsulation layer on the light emitting element, a first touch insulating layer on the encapsulation layer, an overcoat layer on the first touch insulating layer, and defining a first opening, and a cover layer filling the first opening, wherein at least one of the overcoat layer and the cover layer extends from the display area to the peripheral area, and wherein the substrate includes a depression pattern that is filled by the overcoat layer or the cover layer.

20 Claims, 15 Drawing Sheets

(56) References Cited

FOREIGN PATENT DOCUMENTS

| KR | 10-2020-0039866 A | 4/2020 |
| KR | 10-2020-0073549 A | 6/2020 |
| KR | 10-2020-0089379 A | 7/2020 |

\* cited by examiner

DISPLAY DEVICE

CROSS-REFERENCE TO RELATED APPLICATION

This application claims priority to and the benefit of Korean Patent Application No. 10-2020-0179717, filed in the Korean Intellectual Property Office on Dec. 21, 2020, the entire contents of which are incorporated herein by reference.

BACKGROUND

1. Field

The present disclosure relates to a display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device has a multi-layered structure. For example, the display device may have a multi-layered structure in which a light emitting element, a touch sensor, and the like are stacked on a substrate. A screen may be displayed as light generated by the light emitting element passes through several layers of the multi-layered structure to be emitted to the outside of the display device.

The above information disclosed in this Background section is only for enhancement of understanding of the background of the present disclosure, and therefore it may contain information that does not form the prior art that is already known in this country to a person of ordinary skill in the art.

SUMMARY

Embodiments are to provide a display device having a simplified stacked structure. In addition, embodiments are to provide a display device that may improve light emission efficiency and display quality and increase an angle of view of a camera or the like.

Some embodiments provide a display device including a substrate having an opening area, a peripheral area surrounding the opening area, and a display area surrounding the peripheral area, a transistor and a light emitting element on the substrate, an encapsulation layer on the light emitting element, a first touch insulating layer on the encapsulation layer, an overcoat layer on the first touch insulating layer, and defining a first opening, and a cover layer filling the first opening, wherein at least one of the overcoat layer and the cover layer extends from the display area to the peripheral area, and wherein the substrate includes a depression pattern that is filled by the overcoat layer or the cover layer.

The overcoat layer may extend from the display area to the peripheral area, and may contact the encapsulation layer in the peripheral area.

The overcoat layer may at least partially fill the depression pattern.

The display device may further include a second touch insulating layer between the first touch insulating layer and the overcoat layer.

The first touch insulating layer and the second touch insulating layer may overlap the display area, and may be spaced apart from the peripheral area.

The display device may further include a touch electrode on the first touch insulating layer.

Other embodiments provide a display device including a substrate having an opening area, a peripheral area surrounding the opening area, and a display area surrounding the peripheral area, and defining a depression pattern at the peripheral area, a transistor and a light emitting element on the substrate, an encapsulation layer on the light emitting element, a touch insulating layer on the encapsulation layer, a light blocking pattern and a color filter on the touch insulating layer, a first overcoat layer on the color filter, and a cover layer on the first overcoat layer, wherein at least one of the light blocking pattern, the color filter, the first overcoat layer, or the cover layer overlaps the depression pattern.

The display device may further include a second overcoat layer between the color filter and the first overcoat layer, wherein the second overcoat layer extends from the display area to the peripheral area, and contacts the encapsulation layer in the peripheral area.

The second overcoat layer may at least partially fill the depression pattern.

The first overcoat layer may be directly on the color filter, and may extend from the display area to the peripheral area.

The first overcoat layer may at least partially fill the depression pattern.

The first overcoat layer may include a groove overlapping the display area, wherein the cover layer at least partially fills the groove.

A thickness of the first overcoat layer overlapping the color filter in the display area may be less than a thickness of the first overcoat layer overlapping the light blocking pattern.

The display device may include a first auxiliary color filter, a second auxiliary color filter, and a third auxiliary color filter at the peripheral area, and overlapping each other along a thickness direction thereof.

The first auxiliary color filter may include red color filter, wherein the second auxiliary color filter includes green color filter, wherein the third auxiliary color filter includes blue color filter, and wherein the second auxiliary color filter, the third auxiliary color filter, and the first auxiliary color filter are sequentially stacked at the peripheral area.

The display device may further include a second overcoat layer between the color filter and the first overcoat layer.

One of the first auxiliary color filter, the second auxiliary color filter, and the third auxiliary color filter may at least partially fill the depression pattern.

The display device may further include an auxiliary light blocking pattern at the peripheral area.

The auxiliary light blocking pattern may at least partially fill the depression pattern.

The display device may further include an adhesive layer and a cover window that are on the cover layer.

According to some embodiments, a display device having a simplified stacked structure may be provided. In addition, the disclosed embodiments may improve light emission efficiency and display quality of a display device.

DETAILED DESCRIPTION

Figure 1:
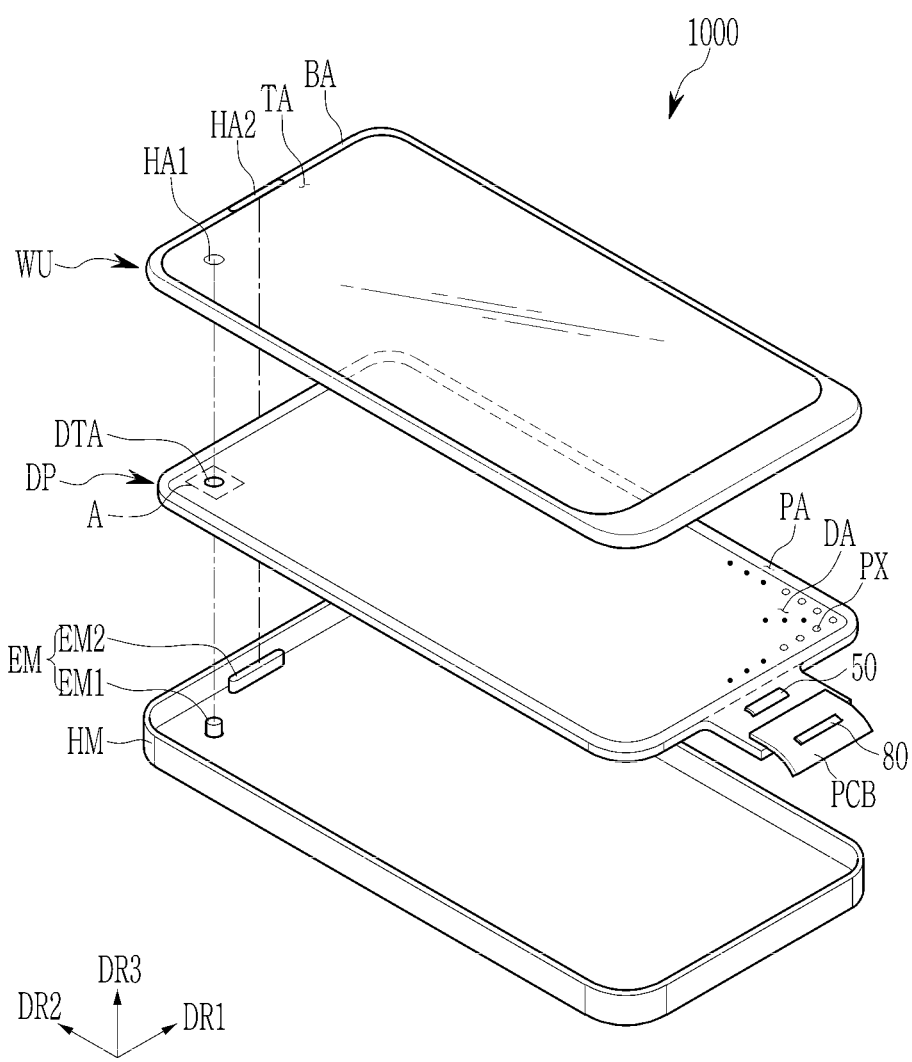
FIG. 1 illustrates an exploded perspective view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions (e.g., first to third direction DR1, DR2, and DR3).

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to some embodiments will be described with reference to FIG. 1 to FIG. 3B. FIG. 1 illustrates an exploded perspective view of a display device according to some embodiments, FIG. 2 illustrates a schematic cross-sectional view of a display device according to some embodiments, FIG. 3A illustrates a top plan view of some constituent elements of a display panel according to some embodiments, and FIG. 3B illustrates a circuit diagram of one pixel according to some embodiments.

Figure 2:
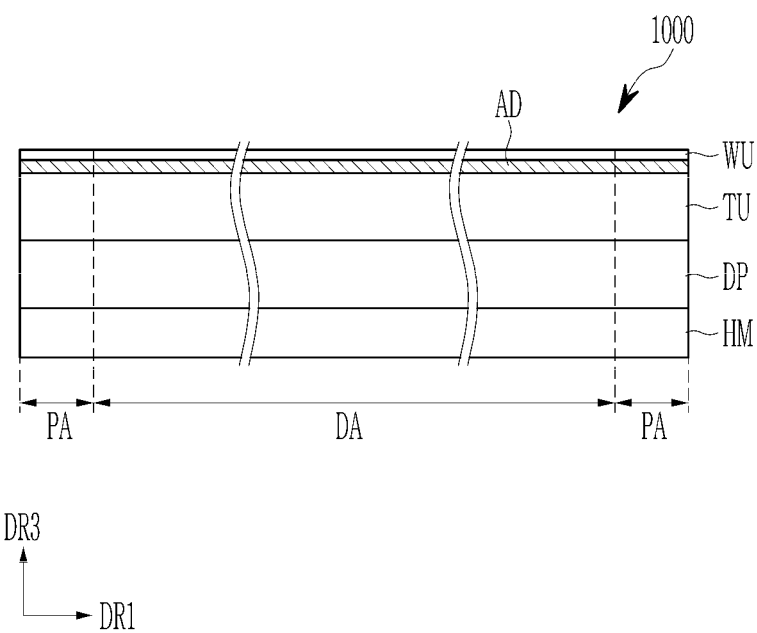
FIG. 2 illustrates a schematic cross-sectional view of a display device according to some embodiments.
Figure 3A:
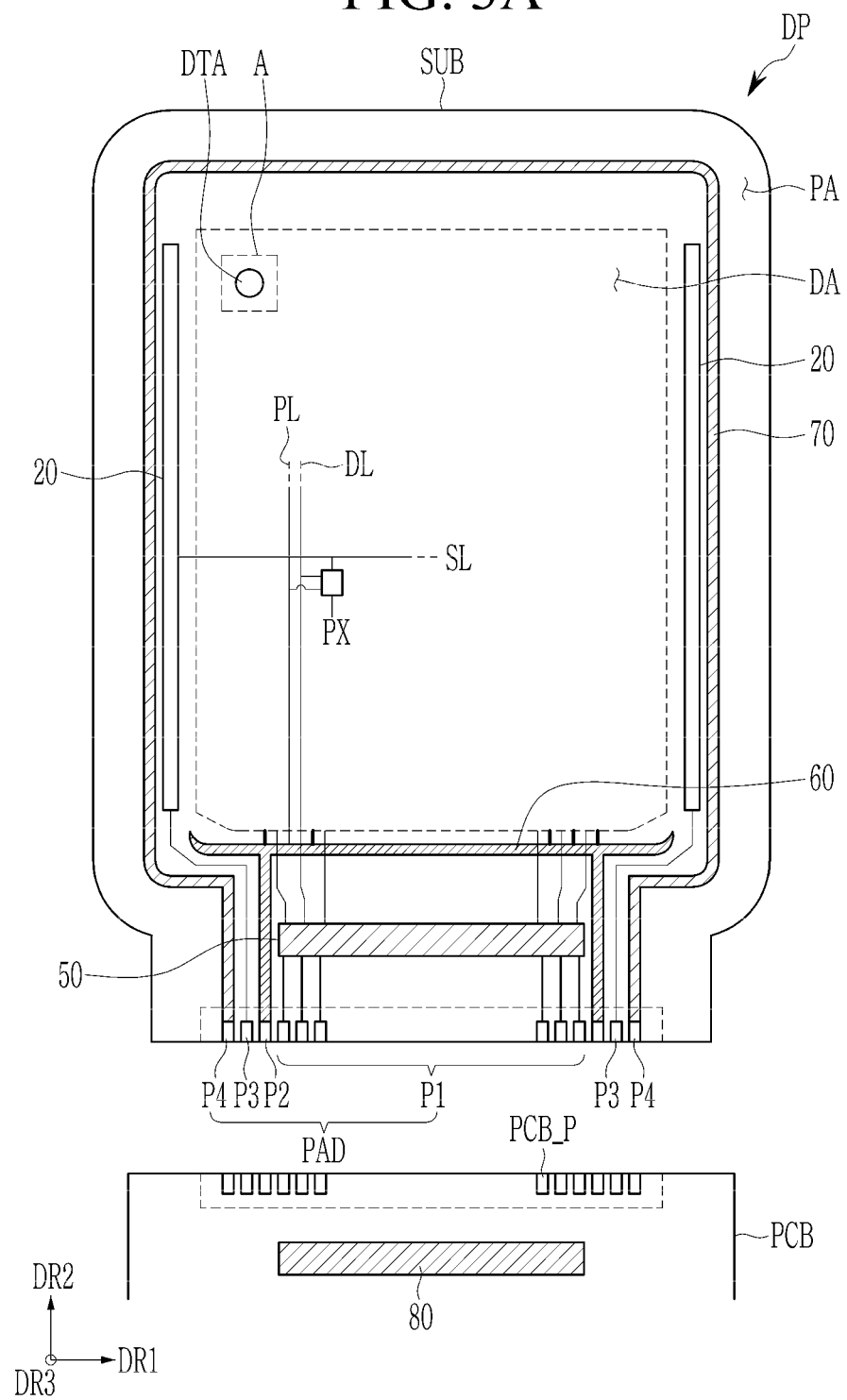
FIG. 3A illustrates a top plan view of some constituent elements of a display panel according to some embodiments.
Figure 3B:
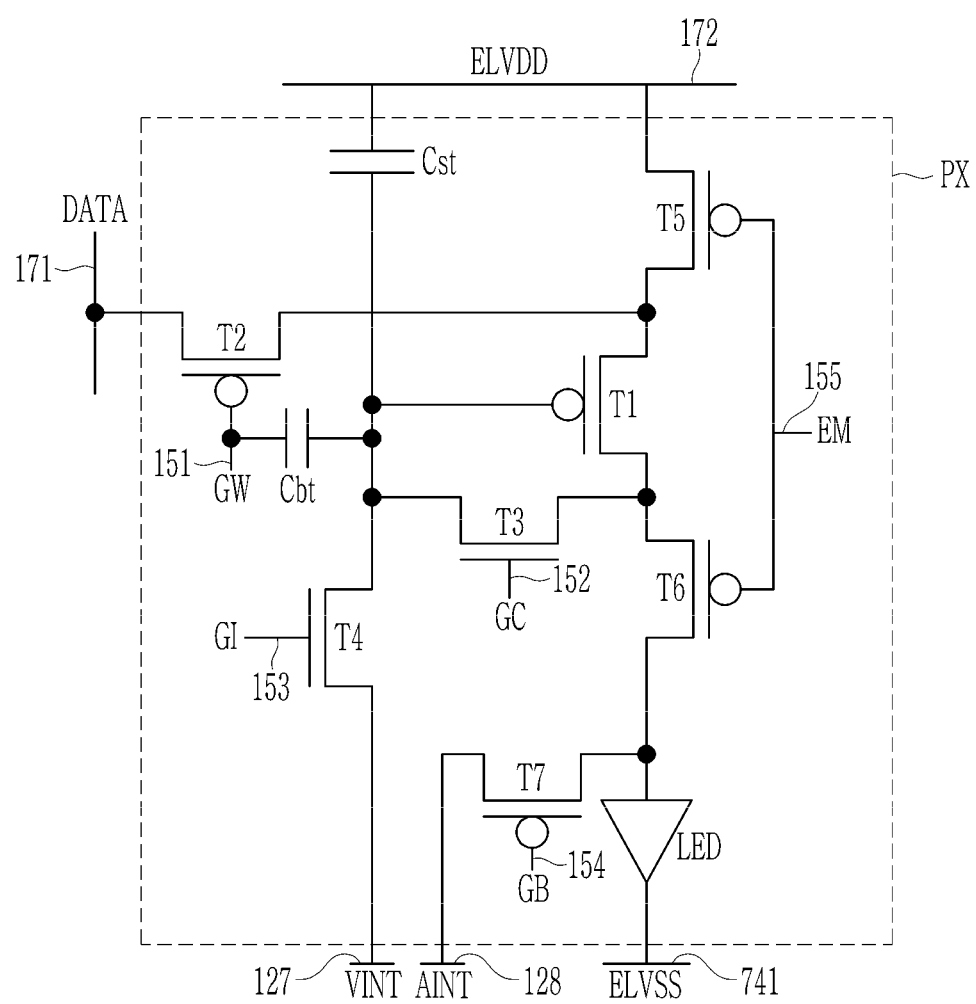
FIG. 3B illustrates a circuit diagram of one pixel according to some embodiments.

First, referring to FIG. 1 and FIG. 2, a display device 1000 displays an image toward a third direction DR3 on a plane defined by a first direction DR1 and a second direction DR2. As described below, a front surface (or upper surface) and a back surface (or lower surface) of each member are divided with respect to the third direction DR3. Directions indicated by the first to third directions DR1, DR2, and DR3 are relative concepts, thus they may be changed into other directions.

The display device 1000 includes a cover window WU, a display panel DP, and a housing member HM, as shown in FIG. 1. In some embodiments, the cover window WU, the display panel DP, and the housing member HM may be combined to form the display device 1000.

The cover window WU is located on the display panel DP to protect the display panel DP. The cover window WU may include a transmission area TA and a blocking area BA. The transmission area TA may be an optically transparent area, and may be an area through which incident light is transmitted. The blocking area BA may be an area having relatively low light transmittance, as compared to the transmission area TA. The blocking area BA defines a shape of the transmission area TA. The blocking area BA may surround the transmission area TA. The blocking area BA may display a color (e.g., a predetermined color). The blocking area BA overlaps a non-display area PA of the display panel DP to block external visibility of the non-display area PA.

The cover window WU may include a first hole area HA1 and a second hole area HA2. Each of the first hole area HA1 and the second hole area HA2 may overlap a respective electronic module EM to be described later. The respective electronic modules EM may operate by receiving external signals provided through the first hole area HA1 and the second hole area HA2.

According to some embodiments, the first hole area HA1 may be located in the transmission area TA, and the second hole area HA2 may be located in the blocking area BA. However, this is only illustrative, and the first hole area HA1 and the second hole area HA2 may be located in opposite areas, may be located such that both of them may be located in the transmission area TA, or may be located such that both of them may be located in the blocking area BA.

In each of the first hole area HA1 and the second hole area HA2, a depression (e.g., a predetermined depression) recessed from a rear surface of the cover window WU may be defined. The depression may include a groove portion or an opening area having a smaller depth than a thickness of the cover window WU.

The first hole area HA1 and the second hole area HA2 may have different shapes. The first hole area HA1 may have a circular shape in a plan view, and the second hole area HA2 may have an elliptical shape having a long axis extending along the first direction DR1 in a plan view. However, the shapes of the first hole area HA1 and the second hole area HA2 are not limited thereto, and the sizes or shapes thereof may be variously changed.

The display panel DP may be a flat rigid display panel, but is not limited thereto, and may be a flexible display panel. The display panel according to some embodiments of the present disclosure may be a light emitting type of display panel, but is not for example limited thereto. For example, the display panel may be an organic light emitting display panel or a quantum dot light emitting display panel. An emission layer of the organic light emitting display panel may include an organic light emitting material. An emission layer of the quantum dot light emitting display panel may include a quantum dot and a quantum rod. Hereinafter, the display panel will be described as an organic light emitting display panel.

An image is displayed on a front surface of the display panel DP. The front surface of the display panel DP includes the display area DA and the non-display area PA. An image is displayed on the display area DA. The non-display area PA may surround the display area DA.

The display panel DP may include a plurality of pixels PX located in the display area DA. The pixels PX may display light in response to an electrical signal. The light displayed by the pixels PX may implement an image. The number of transistors and capacitors included in one pixel PX and their connection relationship may be variously changed.

The display panel DP according to some embodiments may include an opening area DTA penetrating through the display panel DP. The opening area DTA may be located in the display area DA. Hereinafter, area "A" in which the opening area DTA is located will be described. The opening area DTA may overlap the first hole area HA1 of the cover window WU. Some of the plurality of pixels PX may be located to surround the opening area DTA. Accordingly, an image may be displayed in an area adjacent to the opening area DTA.

The display panel DP is extended from the display area DA to include the non-display area PA in which a plurality of signal lines and a pad part are located. A data driver 50 may be located in the non-display area PA. According to some embodiments, a pad part of the non-display area PA may be electrically connected to a printed circuit board (PCB) including a driving chip 80, which will be described in more detail below with reference to FIG. 3A. As shown in FIG. 2, an adhesive layer AD for bonding the display panel DP and the cover window WU may be located between the display panel DP and the cover window WU. The adhesive layer AD may be omitted in some embodiments.

Although not shown in FIG. 1, as shown in FIG. 2, a touch sensing part TU may be located between the display panel DP and the cover window WU. The touch sensing part TU may be located on the display panel DP for a touchscreen function of the display device 1000. The touch sensing part TU may be integrally formed on the display panel DP.

The touch sensing part TU may include a touch electrode of various patterns, and may be formed as a resistive film type or as a capacitance type. The touch sensing part TU may include a touch sensing area for sensing a touch, and a touch peripheral area surrounding the touch sensing area.

The electronic module EM includes various functional modules for operating the display device 1000. The electronic module EM may be electrically connected to the display panel DP through a connector or the like. For example, the electronic module EM may be a camera, a speaker, or a sensing sensor using light or heat.

The electronic module EM may include a first electronic module EM1 and a second electronic module EM2. The first electronic module EM1 may sense an external subject received through the opening area DTA and the first hole area HA1. The first electronic module EM1 may receive an external input transmitted through the opening area DTA and the first hole area HA1, or may provide an output through the opening area DTA and the first hole area HA1.

For example, the first electronic module EM1 may be at least one of a light emitting module, a light sensing module, and a photographing module. For example, the first electronic module EM1 may include at least one of a light emitting module for outputting infrared rays, a CMOS sensor for sensing infrared rays, and a camera module for photographing an external subject.

The second electronic module EM2 may collect a sound signal, such as voice, through the second hole area HA2, or may provide a sound signal, such as processed voice, to the outside (e.g., outside the display device 1000). For example, the second electronic module EM2 may include at least one of a sound input module and a sound output module. The sound input module may include a microphone capable of receiving a sound signal. The sound output module may include a speaker that outputs sound data as a sound signal.

However, this is illustrated as an example, and the electronic module EM may be configured of a single module, may further include a greater number of electronic modules, and may be arranged in various arrangement relationships, but is not limited to any embodiments.

The housing member HM is located at a lower side of the display panel DP. The housing member HM is combined with the cover window WU to form an appearance of the display device 1000. The housing member HM may contain a material with relatively high rigidity. For example, the housing member HM may include a plurality of frames and/or plates made of glass, plastic, and metal. The housing member HM provides an accommodation space (e.g., a predetermined accommodation space). The display panel DP may be accommodated in the accommodation space to be protected from external impact.

Referring to FIG. 3A, the display panel DP includes a substrate SUB including the display area DA and the non-display area PA. The non-display area PA may be defined along an edge of the display area DA.

The display panel DP includes the plurality of pixels PX. The plurality of pixels PX may be located in the display area DA on the substrate SUB. Each of the pixels PX includes a light emitting element and a driving circuit connected to the light emitting element. Each pixel PX emits, for example, red, green, blue, or white light, and may include an organic light emitting element (organic light emitting diode), for example.

The display panel DP may include a plurality of signal lines and a pad part. The plurality of signal lines may include a scan line SL extending in the first direction DR1, and a data line DL and a driving voltage line PL extending in the second direction DR2.

A scan driver 20 generates a scan signal to transmit the scan signal to each pixel PX through the scan line SL. According to some embodiments, the scan driver 20 may be located at left or right sides of the display area DA. In the present specification, a structure in which the scan driver 20 is located at both sides of the substrate SUB is shown, but in other embodiments, the scan driver may be located only at one side of the substrate SUB.

A pad part PAD is located at one end portion of the display panel DP, and includes a plurality of terminals P1, P2, P3, and P4. The pad part PAD may be exposed without being covered by an insulating layer to be electrically connected to the printed circuit board PCB. The pad part PAD may be electrically connected to a pad part PCB_P of the printed circuit board PCB. The printed circuit board PCB may transmit a signal or power source of an IC driving chip 80 to the pad part PAD.

A plurality of image signals transmitted from the outside are converted into a plurality of image data signals, and the converted signals are transmitted to the data driver 50 through the terminal P1. In addition, the controller may receive a vertical synchronization signal, a horizontal synchronization signal, and a clock signal, and may generate a control signal for controlling operations of the scan driver 20 and the data driver 50 to transmit the control signal to each of the scan driver 20 and the data driver 50 through the terminals P3 and P1, respectively. The controller transmits a driving voltage ELVDD to a driving voltage supply wire 60 through the terminal P2. In addition, the controller transmits a common voltage ELVSS to each common voltage supply wire 70 through the terminal P4.

The data driver 50 is located on the non-display area PA, and generates a data signal to transmit it to each pixel PX. The data driver 50 may be located at one side of the display panel DP, and for example, may be located between the pad part PAD and the display area DA.

The driving voltage supply wire 60 is located on the non-display area PA. For example, the driving voltage supply wire 60 may be located between the data driver 50 and the display area DA. The driving voltage supply wire 60 provides the driving voltage ELVDD to the pixels PX. The driving voltage supply wire 60 may be located in the first direction DR1, and may be connected to a plurality of driving voltage lines PL located in the second direction DR2.

The common voltage supply wire 70 is located on the non-display area PA. The common voltage supply wire 70 may have a shape surrounding the substrate SUB. The common voltage supply wire 70 transmits the common voltage ELVSS to one electrode (for example, a second electrode) of the light emitting element included in the pixel PX.

Hereinafter, an example of a plurality of transistors included in one pixel will be described with reference to FIG. 3B.

As shown in FIG. 3B, one pixel PX of the display device according to some embodiments includes transistors T1, T2, T3, T4, T5, T6, and T7), a storage capacitor Cst, a boost capacitor Cbt, and a light emitting diode LED, connected to a plurality of wires 127, 128, 151, 152, 153, 154, 155, 171, 172, and 741.

The plurality of wires 127, 128, 151, 152, 153, 154, 155, 171, 172, and 741 are connected to one pixel PX. The plurality of wires includes a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver to transmit a first scan signal GW to the second transistor T2. The second scan signal line 152 may be applied with a voltage of a polarity that is opposite to a voltage applied to the first scan signal line 151 at the same timing as that of a signal of the first scan signal line 151. For example, when a negative voltage is applied to the first scan signal line 151, a positive voltage may be applied to the second scan signal line 152. The second scan signal line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may include the previous first scan signal line 151 (e.g., the bypass control line 154 may correspond to the scan signal line of a previous row of pixels). The light emission control line 155 transmits a light emission control signal EM to the fifth transistor T5 and the sixth transistor T6.

The data line 171 is a wire that transmits a data voltage DATA generated by a data driver, and luminance emitted by the light emitting diode LED is changed according to the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode electrode of the light emitting diode LED. In some embodiments, the respective voltages applied to the driving voltage line 172, the first and second initialization voltage lines 127 and 128, and the common voltage line 741 may be a constant voltage.

The plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor, and/or a silicon transistor including a polycrystalline silicon semiconductor. For example, the third transistor T3 and the fourth transistor T4 may be formed as oxide transistors, and the driving transistor T1, the second transistor T2, the fifth transistor T5, the sixth transistor T6, and the seventh transistor T7 may be formed as silicon transistors. However, the present disclosure is not limited thereto, and the plurality of transistors may all be formed as silicon transistors, for example.

In the above, it has been described that one pixel includes seven transistors T1 to T7, one storage capacitor Cst, and on one boost capacitor Cbt, but the present disclosure is not limited thereto, and the number of transistors, the number of capacitors, and their connection relationship may be variously changed.

Figure 4A:
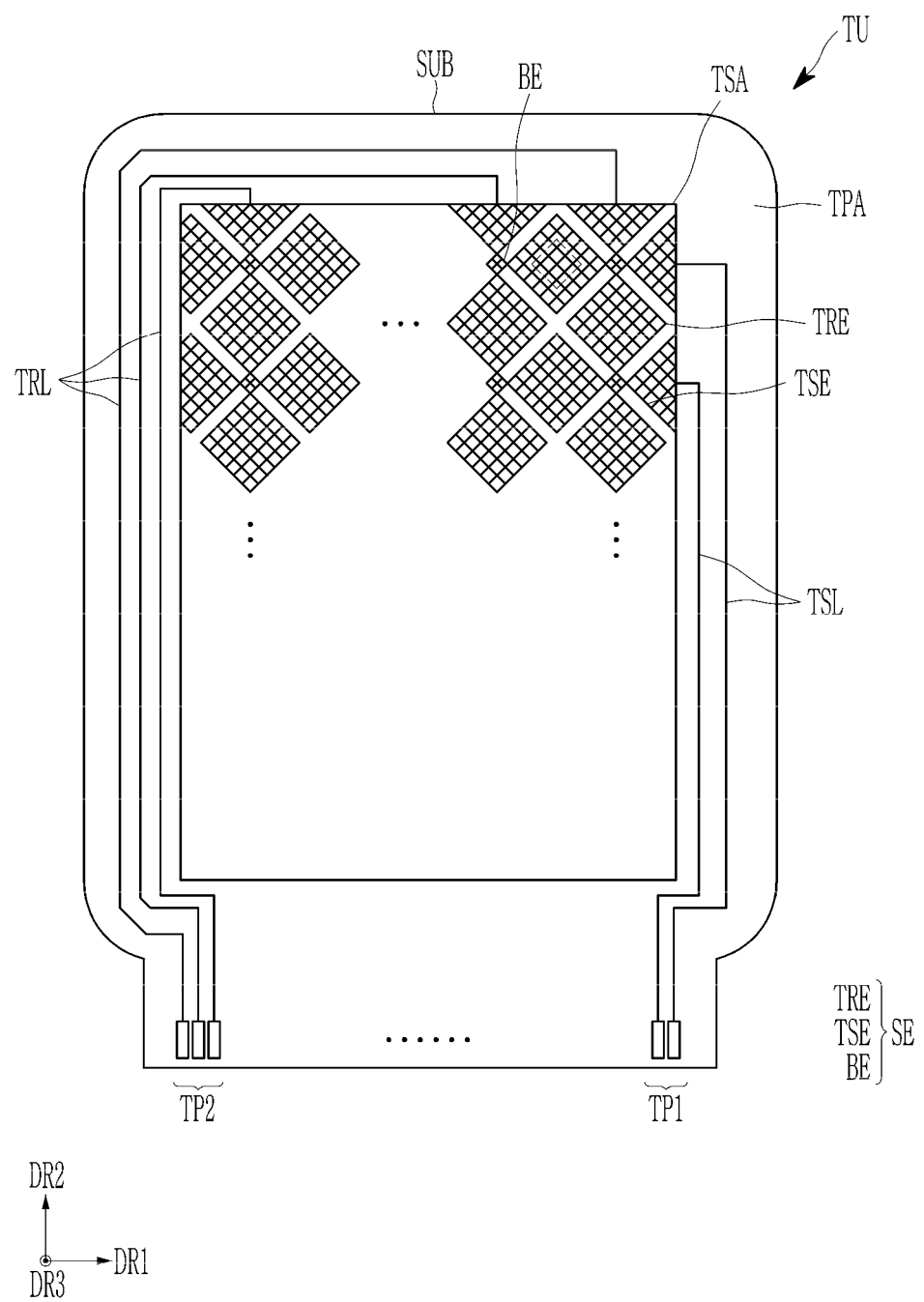
FIG. 4A illustrates a top plan view of a touch sensing part.
Figure 4B:
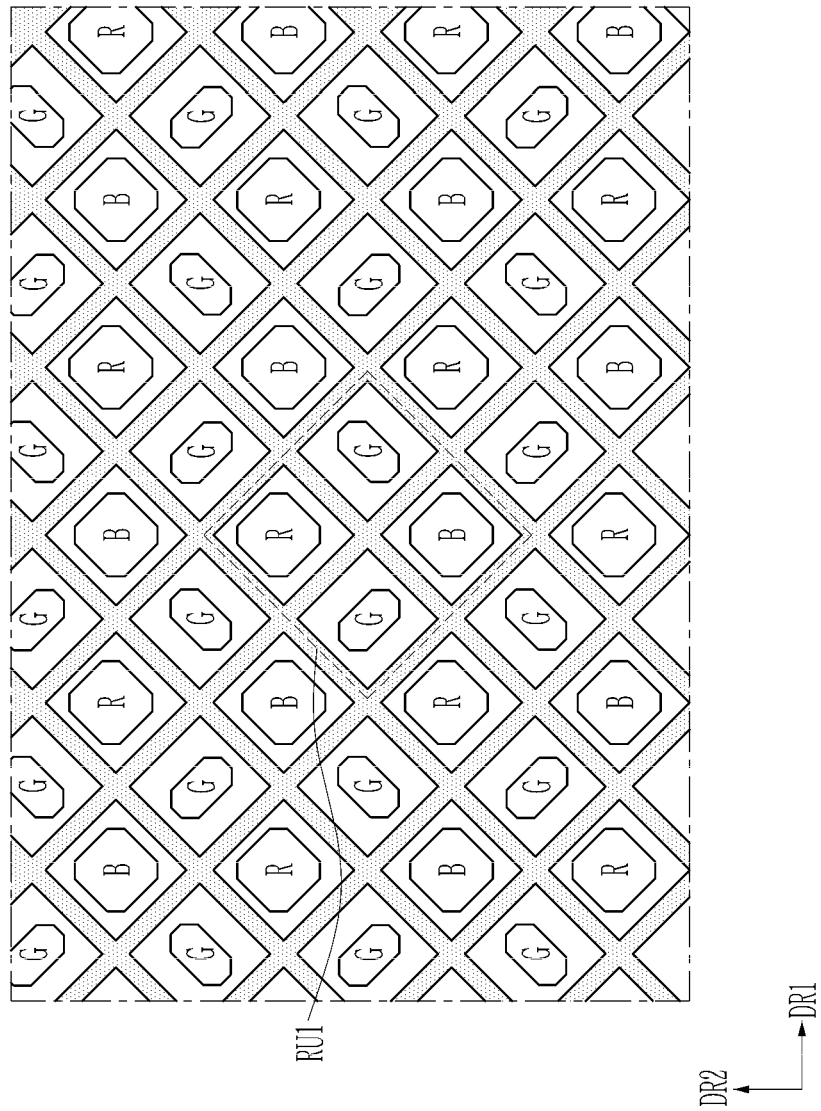
FIG. 4B illustrates a schematic view between the touch sensing part and a pixel of a display panel.

Hereinafter, a touch sensing part located on a display panel will be described with reference to FIG. 4A and FIG. 4B. FIG. 4A illustrates a top plan view of a touch sensing part, and FIG. 4B illustrates a schematic view between the touch sensing part and a pixel of a display panel.

Referring to FIG. 4A, the touch sensing part TU includes a touch sensing area TSA for sensing a user's touch, and a touch peripheral area TPA located around the touch sensing area TSA. The touch sensing area TSA may overlap the display area DA of the display panel DP, and the touch peripheral area TPA may overlap the non-display area PA of the display panel DP.

Touch electrodes SE may be located in the touch sensing area TSA. The touch electrodes SE may include sensing electrodes TSE that are electrically connected to each other along the first direction DR1, and driving electrodes TRE that are electrically connected to each other along the second direction DR2. In the present specification, shown are embodiments in which the touch electrode SE including the sensing electrode TSE and the driving electrode TRE has a diamond shape in a plan view, but the present disclosure is not limited thereto. The touch electrode SE may have a mesh shape as shown in FIG. 4A.

To prevent the sensing electrodes TSE and the driving electrodes TRE from being short-circuited to each other in an area in which they cross each other, the driving electrodes TRE adjacent to each other in the second direction DR2 are electrically connected to each other through a bridge electrode BE. In this case, the driving electrodes TRE and the sensing electrodes TSE may be located on one layer, and the bridge electrode BE may be located on a different layer from the driving electrodes TRE and the sensing electrodes TSE.

Touch lines TSL and TRL may be located in the touch peripheral area TPA. The touch lines TSL and TRL may include a sensing line TSL connected to a sensing electrode TSE, and a driving line TRL connected to a driving electrode TRE. The sensing line TSL may be connected to a first touch pad TP1, and the driving line TRL may be connected to a second touch pad TP2.

The touch electrodes SE may be driven by a mutual capacitance method or by a self-capacitance method.

FIG. 4B illustrates a top plan view of a disposition relationship between the pixels of FIG. 3A and the touch electrode of FIG. 4A. Referring to FIG. 4B, a plurality of pixels may include a first color pixel (R), a second color pixel (G), and a third color pixel (B). According to an example, the first color may be red, the second color may be green, and the third color may be blue, but the present disclosure is not limited thereto.

According to some embodiments, one first color pixel (R), two second color pixels (G), and one third color pixel (B) that are adjacent to each other may be used as one repeating unit RU1 to express a white gray.

In the display panel DP, the number of the first color pixels (R) and the number of the third color pixels (B) may be the same. The number of the second color pixels (G) in the display panel DP may be twice the number of the first color pixels (R) and twice the number of the third color pixels (B). In addition, the number of the second color pixels (G) in the display panel DP may be the same as a sum of the number of the first color pixels (R) and the number of the third pixels (B).

As shown in FIG. 4B, the first color pixel (R), the second color pixel (G), and the third color pixel (B) may be formed in a polygonal shape (for example, an octagonal shape that may be close to a rhombus shape) when viewed in a plan view. The embodiments of the present disclosure are not limited thereto, and the first color pixel (R), the second color pixel (G), and the third color pixel (B) may be formed in a rectangle or square shape when viewed in a plan view, and may be formed in another polygon shape other than the quadrangle shape, and a circle or ellipse shape. In addition, the shape of the first color pixel (R), the shape of the second color pixel (G), and the shape of the third color pixel (B) may be different from each other.

FIG. 4B illustrates that the size of the first color pixel (R) and the size of the third color pixel (B) are the same when viewed in a plan view, but some embodiments of the present disclosure is not limited thereto. That is, when viewed in a plan view, the size of the first color pixel (R), the size of the second color pixel (G), and the size of the third color pixel (B) may be different from each other. For example, when viewed in a plan view, the size of the first color pixel (R) may be larger than the size of the second color pixel (G), and the size of the third color pixel (B) may be larger than the size of the second color pixel (G). In addition, when viewed in a plan view, the size of the first color pixel (R) may be substantially the same as the size of the third color pixel (B), or may be smaller than the size of the third color pixel (B).

The touch electrode SE has a mesh shape, and the pixels R, G, and B of the first color to the third color may be located between the mesh shapes (e.g., in areas not covered by the mesh). Accordingly, it is possible to prevent the opening areas of the first to third color pixels R, G, and B from being reduced for the touch electrode SE.

Figure 5A:
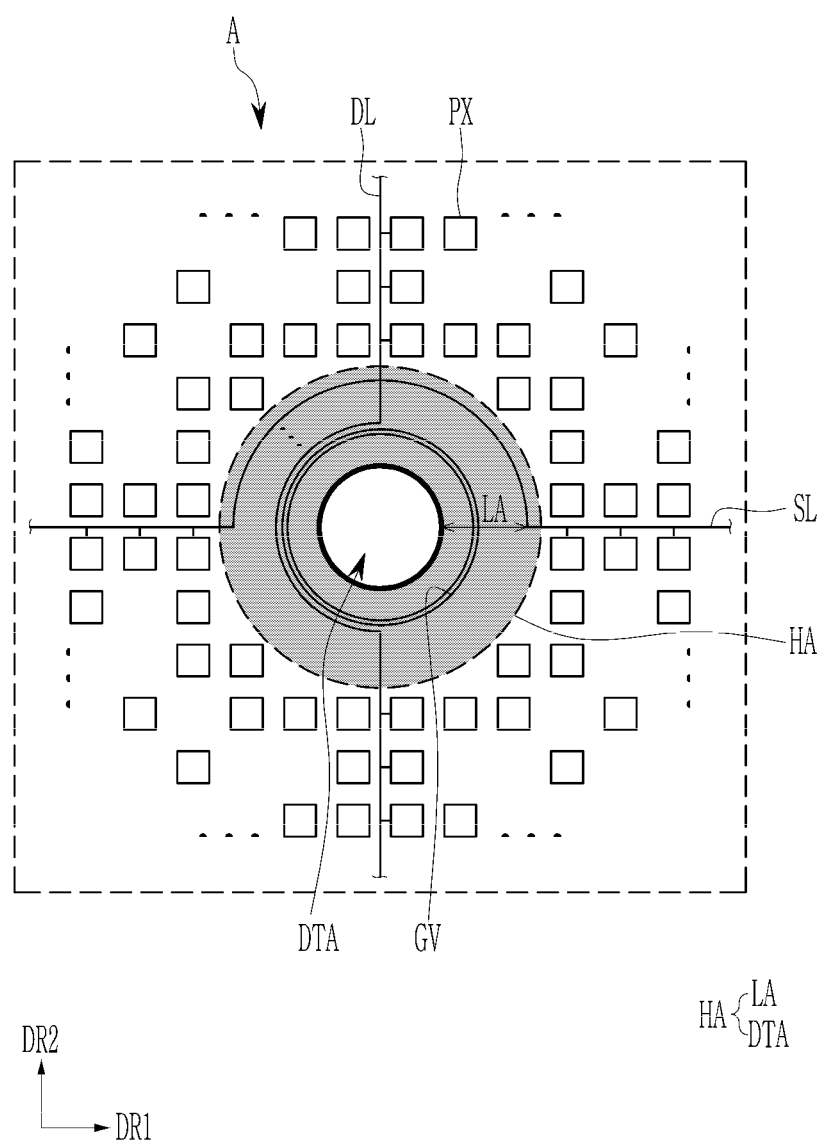
FIG. 5A illustrates an enlarged top plan view of area "A" of FIG. 1 and of FIG. 3A.
Figure 5B:
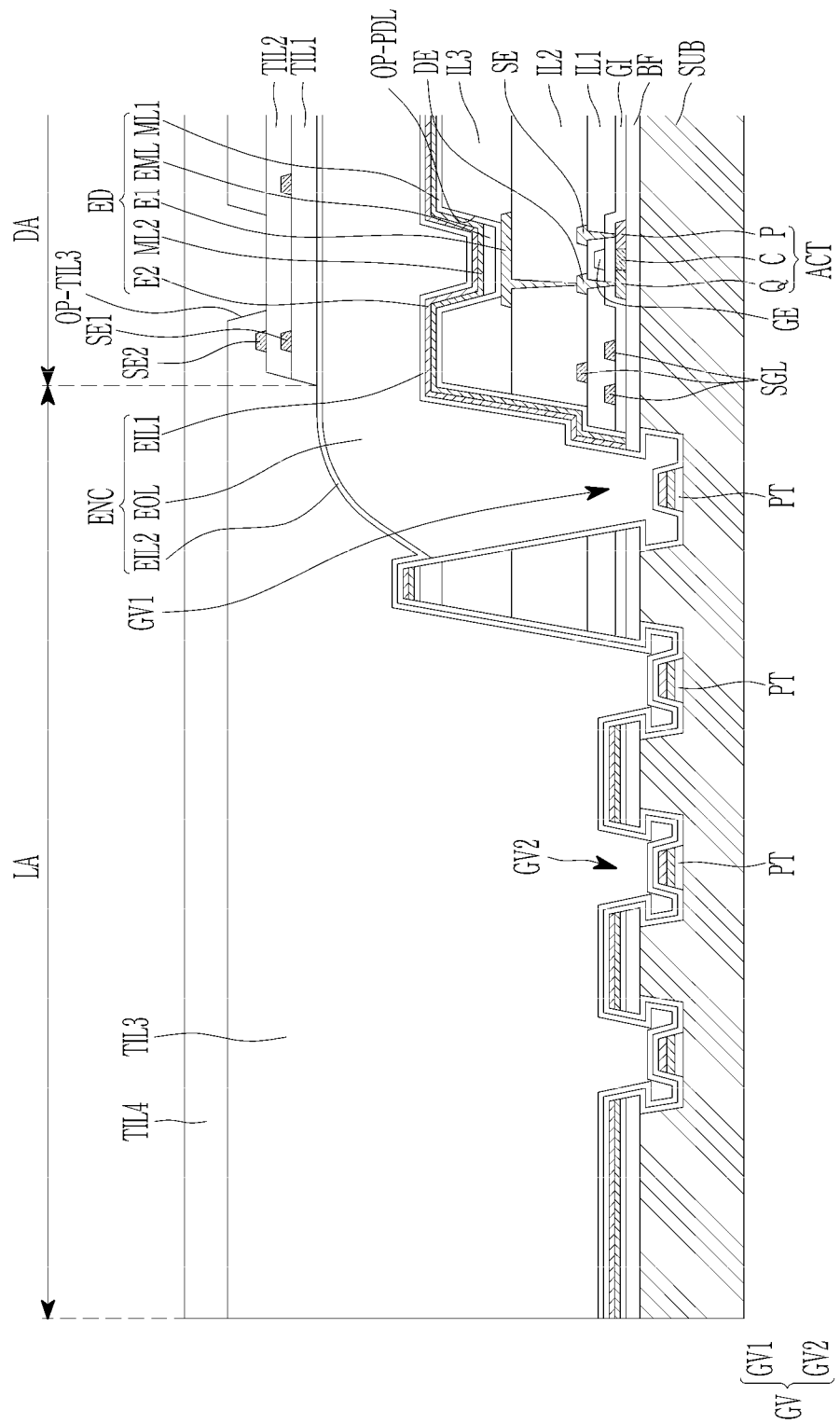
FIG. 5B illustrates a cross-sectional view of a display device corresponding to a display area and a peripheral area.

Hereinafter, the area "A" including the opening area DTA shown in FIG. 1 and FIG. 3A will be described with reference to FIG. 5A and FIG. 5B. FIG. 5A illustrates an enlarged top plan view of area "A" of FIG. 1 and of FIG. 3A, and FIG. 5B illustrates a cross-sectional view of a display device corresponding to a display area and a peripheral area.

Referring to FIG. 5A together with the above-described drawings, the display panel DP includes a plurality of signal lines SL and DL and a plurality of pixels PX located on the substrate. Each of the plurality of pixels PX may be connected to the plurality of signal lines SL and DL. FIG. 5A illustrates the scan line SL and the data line DL among a plurality of signal lines. However, this is illustrated as an example, and each of the pixels PX according to some embodiments of the present disclosure may be additionally connected to various signal lines, and is not limited to any of the embodiments.

The hole area HA included in the display panel DP includes the opening area DTA and a peripheral area LA surrounding the opening area DTA. The peripheral area LA is an area surrounding a periphery of the opening area DTA. A minimum width of the peripheral area LA may be suitably maintained as a constant width. Meanwhile, the peripheral area LA includes a depression pattern GV. The depression pattern GV will be described in more detail with reference to FIG. 5B.

The scan line SL and the data line DL may have a semicircular structure, may overlap the peripheral area LA, and may bypass the opening area DTA. The plurality of scan lines SL extend in a horizontal direction along a periphery of the opening area DTA. Here, the plurality of scan lines SL may be configured of a scan line, an emission control line, an initialization voltage line, or the like according to corresponding signals. The plurality of data lines DL extend in a vertical direction along the periphery of the opening area DTA. The plurality of data lines DL may be configured of a driving voltage line and a driving low voltage line according to corresponding signals. In some embodiments, the plurality of scan lines SL and the plurality of data lines DL may be changed.

First, a stacked structure of the display area DA will be described with reference to FIG. 5B. In the present specification, a simplified stacked structure of the display area DA is shown, but any stacked structure for implementing the circuit of FIG. 3B is possible.

Referring to FIG. 5B, the substrate SUB according to some embodiments may include an inorganic insulating material, such as glass, or an organic insulating material, such as plastic (e.g., polyimide (PI)). The buffer layer SUB may be single-layered or multi-layered. The substrate SUB may have a structure in which at least one base layer and at least one inorganic layer, which may include polymer resins that are sequentially stacked, are alternately stacked.

The substrate SUB may have various degrees of flexibility. The substrate SUB may be a rigid substrate, or a flexible substrate that is bendable, foldable, or rollable.

A buffer layer BF may be located on the substrate SUB. The buffer layer BF blocks impurities from being transmitted from the substrate SUB to an upper layer of the buffer layer BF, for example, to a semiconductor layer ACT, thereby preventing characteristic degradation of the semiconductor layer ACT and reducing stress. The buffer layer BF may include an inorganic insulating material, such as a silicon nitride or a silicon oxide, or an organic insulating material. A portion or all of the buffer layer BF may be omitted in other embodiments.

The semiconductor layer ACT is located on the buffer layer BF. The semiconductor layer ACT may include at least one of polycrystalline silicon and an oxide semiconductor. The semiconductor layer ACT includes a channel area (C), a first area (P), and a second area (Q). The first area (P) and the second area (Q) are located at respective sides of the channel area (C). The channel area (C) may include a semiconductor with a small amount of impurity doped, or a semiconductor with no impurity doped, and the first area (P) and the second area (Q) may include semiconductors with a large amount of impurity doped compared to the channel area (C). The semiconductor layer ACT may be formed of an oxide semiconductor, and in this case, a separate passivation layer may be added to protect an oxide semiconductor material that is vulnerable to external environments, such as high temperature environments.

The gate insulating layer GI is located on the semiconductor layer ACT. The gate insulating layer GI may be a single layer or multilayer including at least one of a silicon oxide ($SiO_x$), a silicon nitride ($SiN_x$), and/or a silicon oxynitride ($SiO_xN_y$).

A gate electrode GE is located on the gate insulating layer GI. The gate electrode GE may be a single layer, or multilayer in which metal films containing one of copper (Cu), a copper alloy, aluminum (Al), an aluminum alloy, molybdenum (Mo), a molybdenum alloy, titanium (Ti), and/or a titanium alloy are stacked. The gate electrode GE may overlap the channel area (C) of the semiconductor layer ACT.

A first insulating layer IL1 is located on the gate electrode GE and the gate insulating layer GI. The first insulating layer IL1 may be a single layer, or multilayer including at least one of a silicon oxide ($SiO_x$), a silicon nitride ($SiN_x$), and/or a silicon oxynitride ($SiO_xN_y$).

The source electrode SE and the drain electrode DE are located on the first insulating layer IL1. The source electrode SE and the drain electrode DE are respectively connected to the first area (P) and the second area (Q) of the semiconductor layer ACT through respective contact holes formed in the first insulating layer IL1.

The source electrode SE and the drain electrode DE may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including them.

A second insulating layer IL2 is located on the first insulating layer IL1, the source electrode SE, and the drain electrode DE. The second insulating layer IL2 may include an organic insulating material, such as a general purpose polymer such as poly(methyl methacrylate) (PMMA) or polystyrene (PS), a polymer derivative having a phenolic group, a acryl-based polymer, an imide-based polymer, a polyimide, an acryl-based polymer, and/or a siloxane-based polymer.

A first electrode E1 is located on the second insulating layer IL2. The first electrode E1 is electrically connected to the drain electrode DE through a contact hole of the second insulating layer IL2.

The first electrode E1 may contain a metal such as silver (Ag), lithium (Li), calcium (Ca), aluminum (Al), magnesium (Mg), or gold (Au), and/or may also contain a transparent conductive oxide (TCO) such as an indium tin oxide (ITO) or an indium zinc oxide (IZO). The first electrode E1 may be formed of a single layer including a metal material or a transparent conductive oxide, or a multilayer including them. For example, the first electrode E1 may have a triple-layered structure of indium tin oxide (ITO)/silver (Ag)/indium tin oxide (ITO).

A transistor configured of the gate electrode GE, the semiconductor layer ACT, the source electrode SE, and the drain electrode DE is connected to the first electrode E1 to supply a current to a light emitting element ED.

A pixel defining layer IL3 is located on the second insulating layer IL2 and the first electrode E1. In some embodiments, a spacer may be located on the pixel defining layer IL3.

The pixel defining layer IL3 overlaps at least a portion of the first electrode E1, and has a pixel opening OP-PDL defining an emission area. The pixel opening OP-PDL may have a planar shape that is substantially similar to that of the first electrode E1. The pixel opening OP-PDL may have a rhombus shape, or may have an octagonal shape similar to a rhombus shape, in a plan view, but is not limited thereto, and may have various shapes such as a quadrangle, a polygon, or a circle.

The pixel defining layer IL3 and the spacer may include an organic insulating material, such as a general purpose polymer such as poly(methyl methacrylate) (PMMA) or polystyrene (PS), a polymer derivative having a phenolic group, a acryl-based polymer, an imide-based polymer, a polyimide, an acryl-based polymer, and/or a siloxane-based polymer.

An emission layer EML is located on the first electrode E1 overlapping the pixel opening OP-PDL. The emission layer may include an organic material and/or an inorganic material. The emission layer EML may generate colored light (e.g., predetermined colored light). The emission layer EML may be formed to be located only within the pixel opening OP-PDL by using a mask.

Intermediate layers ML1 and ML2 may be located above and below the emission layer EML. The first intermediate layer ML1 may be a film or multi-film including at least one of a hole injection layer (HIL) and a hole transporting layer (HTL), and the second intermediate layer ML2 may be a film or multi-film including at least one of an electron transporting layer (ETL) and an electron injection layer (EIL). The intermediate layers ML1 and ML2 may overlap a front surface of the substrate SUB.

A second electrode E2 is located on the intermediate layers ML1 and ML2. The second electrode E2 may include a reflective metal including calcium (Ca), barium (Ba), magnesium (Mg), aluminum (Al), silver (Ag), gold (Au), nickel (Ni), chromium (Cr), lithium (Li), or calcium (Ca), or a transparent conductive oxide (TCO) such as an indium tin oxide (ITO) or an indium zinc oxide (IZO).

The first electrode E1, the emission layer EML, the intermediate layers ML1 and ML2, and the second electrode E2 may form the light emitting element ED. Here, the first electrode E1 may be an anode, which is a hole injection electrode, and the second electrode E2 may be a cathode, which is an electron injection electrode. However, some embodiments are not necessarily limited thereto, and the first electrode E1 may be a cathode and the second electrode E2 may be an anode, according to a driving method of the light emitting display device.

Holes and electrons are injected into the emission layer EML from the first electrode E1 and the second electrode E2, respectively, and light is emitted when excitons in which the injected holes and electrons are combined enter a ground state from an excited state.

An encapsulation layer ENC is located on the second electrode E2. The encapsulation layer ENC may cover and seal not only an upper surface of, but also a side surface of, the light emitting element ED. Because the light emitting element is vulnerable to moisture and oxygen, the encapsulation layer ENC seals the light emitting element ED to block inflow of moisture and oxygen from the outside.

The encapsulation layer ENC may include a plurality of layers, and in this case, the encapsulation layer ENC may be formed as a composite film including both an inorganic layer and an organic layer, and for example, the encapsulation layer ENC may be formed as a triple layer in which a first encapsulation inorganic layer EIL1, an encapsulation organic layer EOL, and a second encapsulation inorganic layer EIL2 are sequentially formed.

The first encapsulated inorganic layer EIL1 may cover the second electrode E2. The first encapsulated inorganic layer EIL1 may reduce or prevent external moisture or oxygen penetrating into the light emitting element ED. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be located on the first encapsulation inorganic layer EIL1 to contact the first encapsulation inorganic layer EIL1. Curved or irregular portions formed on an upper surface of the first encapsulation inorganic layer EIL1, or particles being present on the first encapsulation inorganic layer EIL1, are covered by the encapsulation organic layer EOL, so that influence on constituent elements formed on the encapsulation organic layer EOL by the surface state of the upper surface of the first encapsulation inorganic layer EIL1 may be blocked. In addition, the encapsulation organic layer EOL may reduce stress between layers in contact with each other. The encapsulation organic layer EOL may include an organic material, and may be formed through a solution process, such as a spin coating, slit coating, or an inkjet process.

The second encapsulation inorganic layer EIL2 is located on the encapsulation organic layer EOL to cover the encapsulation organic layer EOL. The second encapsulation inorganic layer EIL2 may be stably formed on a relatively flat surface, as compared to the first encapsulation inorganic layer EIL1. The second encapsulation inorganic layer EIL2 encapsulates moisture discharged from the encapsulation organic layer EOL to prevent outflow to the outside. The second encapsulation inorganic layer EIL2 may include a silicon nitride, a silicon oxide, a silicon oxynitride, or a combination thereof. The second encapsulation inorganic layer EIL2 may be formed through a deposition process.

In some embodiments, a capping layer located between the second electrode E2 and the encapsulation layer ENC may be further included. The capping layer may include an organic material. The capping layer protects the second electrode E2 from a subsequent process, for example, a sputtering process, and improves light emitting efficiency of the light emitting element ED. The capping layer may have a refractive index that is larger than that of the first encapsulation inorganic layer EIL1.

A first touch insulating layer TIL1, a second touch insulating layer TIL2, an overcoat layer TIL3, and a cover layer TIL4 may be located on the encapsulation layer ENC according to some embodiments.

The first touch insulating layer TIL1 may include at least one of an inorganic layer and an organic layer. The inorganic layer may include at least one of a silicon oxide, a silicon nitride, and a silicon oxynitride. The organic layer may include a polymer-based material. The first encapsulation inorganic layer EIL1, the second encapsulation inorganic layer EIL2, and the first touch insulating layer TIL1 may be made of the same material, and may include, for example, the same inorganic material.

One portion (e.g., a first portion) SE1 of the touch electrode may be located on the first touch insulating layer TIL1. For example, one portion SE1 of the touch electrode may be the aforementioned bridge electrode BE. The embodiments in which one portion SE1 of the touch electrode located on the first touch insulating layer TIL1 is the bridge electrode BE is described, but the present disclosure is not limited thereto, and one portion SE1 of the touch electrode may be the sensing electrode TSE or the driving electrode TRE.

The second touch insulating layer TIL2 may be located on the first touch insulating layer TIL1. The second touch insulating layer TIL2 may completely cover one portion SE1 of the touch electrode.

The other portion (e.g., a second portion) of the touch electrode SE2 may be located between the second touch insulating layer TIL2 and the overcoat layer TIL3. The other portion SE2 of the touch electrode may be the sensing electrode TSE and/or the driving electrode TRE, which are described above. In the present specification, embodiments in which the bridge electrode BE is located between the second touch insulating layer TIL2 and the first touch insulating layer TIL1, and in which the sensing electrode TSE and the driving electrode TRE are located between the second touch insulating layer TIL2 and the overcoat layer TIL3, are described. However, the present disclosure is not limited thereto, and some embodiments in which locations of the bridge electrode and the sensing electrode and the driving electrode (e.g., portions SE1 and SE2) are interchanged is also possible.

The first touch insulating layer TIL1 and the second touch insulating layer TIL2 according to some embodiments may overlap the display area DA. In addition, the first touch insulating layer TIL1 and the second touch insulating layer TIL2 may be spaced apart from the peripheral area LA. However, they may overlap a portion of the edge of the peripheral area LA due to a misalignment during the manufacturing process.

The overcoat layer TIL3 may be located on the second touch insulating layer TIL2. The overcoat layer TIL3 may have a shape overlapping the front surface of the substrate SUB. The overcoat layer TIL3 may include a light-transmitting organic material having a low refractive index. For example, the overcoat layer TIL3 may include an acrylic resin, a polyimide resin, a polyamide resin, and Alq$_3$[tris(8-hydroxyquinolinato)aluminum]. The overcoat layer TIL3 may have a relatively smaller refractive index than the cover layer TIL4 to be described later. For example, the refractive index of the overcoat layer TIL3 may be about 1.5 to about 1.55.

The overcoat layer TIL3 may have a first opening OP-TIL3. The first opening OP-TIL3 means a portion that is not covered by the overcoat layer TIL3. The first opening OP-TIL3 may overlap the pixel opening OP-PDL.

The cover layer TIL4 may be located on the overcoat layer TIL3. The over layer TIL4 may have a shape overlapping the front surface of the substrate SUB. The over layer TIL4 may include a light-transmitting organic material having a high refractive index. The cover layer TIL4 may have a relatively larger refractive index than the overcoat layer TIL3. For example, the refractive index of the cover layer TIL4 may be about 1.61 or higher, and for example, may be about 1.61 to about 1.80.

The cover layer TIL4 may further include dispersed particles for a high refractive index. The cover layer TIL4 may include, for example, metal oxide particles such as a zinc oxide (ZnO$_x$), titanium oxide (TiO$_2$), or zirconium oxide (ZrO$_2$).

The cover layer TIL4 may be located within the first opening OP-TIL3 of the overcoat layer TIL3. The cover layer TIL4 may contact at least one side surface of the overcoat layer TIL3. The cover layer TIL4 may be located to cover an upper surface of the overcoat layer TIL3. In other embodiments, an anti-reflection layer including a linear polarization layer and a phase difference layer may be further located on the cover layer TIL4.

The display device according to some embodiments includes the overcoat layer TIL3 including the first opening OP-TIL3 and the cover layer TIL4 located in the first opening OP-TIL3, thereby improving front visibility and light emission efficiency of the display device. At least a portion of the light generated by the light emitting element ED is totally reflected by an interface between the overcoat layer TIL3 and the cover layer TIL4, so that the light may be condensed in the front.

For example, the light generated from the emission layer EML may be directed in various directions, and may be incident toward the first touch insulating layer TIL1 with various incident angles. In this case, at least a portion of the light incident on the cover layer TIL4 is reflected at an interface between the overcoat layer TIL3 and the cover layer TIL4. For example, when the incident angle of light incident on the cover layer TIL4 is larger than a threshold angle, the incident light may be totally reflected at the interface between the overcoat layer TIL3 and the cover layer TIL4. That is, while light incident on the cover layer TIL4 having a relatively large refractive index proceeds to the overcoat layer TIL3 having a relatively small refractive index, the total reflection may occur at the interface between the overcoat layer TIL3 and the cover layer TIL4.

Hereinafter, the opening area DTA and a hole area including the peripheral area LA of the opening area DTA will be described.

The substrate SUB may further include the depression pattern GV defined in the peripheral area LA. The depression pattern GV may be defined along an edge of a through-hole/the opening area DTA. In some embodiments, the depression pattern GV may have a closed line shape surrounding the through-hole DTA. The depression pattern GV may have a circular shape similar to a shape of the through-hole DTA. However, this is an example, and the depression pattern GV may have a different shape from the through-hole DTA, may have a polygonal shape, an elliptical shape, or a closed line shape including at least a partial curved line, or may have a shape including a plurality of patterns that are partially disconnected. However, it is not limited to the embodiments described above.

The depression pattern GV refers to an area that is recessed from the front surface of the display panel DP. The depression pattern GV may be formed by removing some of the constituent elements of the display panel DP. Unlike the through-hole DTA, the depression pattern GV does not penetrate through the display panel DP. A rear surface of the substrate SUB overlapping the depression pattern GV is not opened by the depression pattern GV.

The depression pattern GV may be formed by leaving a portion of the substrate SUB while penetrating a remaining portion thereof. According to some embodiments, the depression pattern GV may be formed by connecting a through-portion formed in the buffer layer BF and the depression formed in the substrate SUB. An inner surface of the depression pattern GV may be covered by at least one of the first encapsulation inorganic layer EIL1 and the second encapsulation inorganic layer EIL2.

The depression pattern GV may have an undercut shape. The depression pattern GV may have a tip shape protruding toward the inside. The buffer layer BF protrudes further toward the inside of the depression pattern GV than the substrate SUB, so that the tip shape may be formed.

The display panel DP according to some embodiments may further include an island-shaped first pattern PT located in the depression pattern GV. The first pattern PT may include the same material as at least one of the intermediate layers ML1 and ML2 and the second electrode E2. The first pattern PT may have a single layered or multi-layered structure.

The first pattern PT may be spaced apart from the intermediate layers ML1 and ML2 and the second electrode E2 to be located within the depression pattern GV. The first pattern PT may be covered by the first encapsulation inorganic layer EIL1 to not be exposed to the outside.

The depression pattern GV may block continuity of the intermediate layers ML1 and ML2 between the display area DA and the through-hole DTA. The intermediate layers ML1 and ML2 may be disconnected in the area overlapping the depression pattern GV. The intermediate layers ML1 and ML2 may be paths for foreign matters such as moisture or air to move. The path through which moisture or air that may be otherwise introduced from one end of the intermediate layers ML1 and ML2, which are exposed by the through-hole DTA, to pass through the peripheral area LA and flow into the display area DA may be blocked by the depression pattern GV. Accordingly, reliability of the display panel DP in which the through-hole DTA is formed may be improved.

A plurality of depression patterns GV arranged to be spaced apart from each other may be provided. A portion of the depression pattern GV may be filled (e.g., at least partially filled) by the encapsulation organic layer EOL. In addition, in the display panel DP according to some embodiments, the depression pattern GV may be omitted, and is not limited to any particular embodiments.

The depression pattern GV may include a first depression pattern GV1 and a second depression pattern GV2. In a plan view, the first depression pattern GV1 may surround the second depression pattern GV2. The through-hole DTA, the second depression pattern GV2, and the first depression pattern GV1 may be spaced apart from each other. In the present specification, two depression patterns GV are shown, but the present disclosure is not limited thereto, and one or more depression patterns may be included.

The first encapsulation inorganic layer EIL1 may overlap the first depression pattern GV1 and the second depression pattern GV2. The first encapsulation inorganic layer EIL1 may be located along inner surfaces of the first depression pattern GV1 and the second depression pattern GV2. The first depression pattern GV1 and the second depression pattern GV2 may be covered by the first encapsulation inorganic layer EIL1.

The encapsulation organic layer EOL may fill the first depression pattern GV1, and might not fill the second depression pattern GV2.

The second encapsulation inorganic layer EIL2 may extend up to an area in which the first depression pattern GV1 and the second depression pattern GV2 are located. The second encapsulation inorganic layer EIL2 may be located along the encapsulation organic layer EOL filling the first depression pattern GV1. The second encapsulation inorganic layer EIL2 might not be located inside the first depression pattern GV1. The second encapsulation inorganic layer EIL2 may be located along an inner surface of the second depression pattern GV2.

Meanwhile, the display panel DP may include a signal line SGL overlapping the peripheral area LA. The signal line SGL may be located on the same layer as the gate electrode GE located in the display area DA, and/or may be located on the same layer as the source electrode SE and the drain electrode DE.

According to some embodiments, in the peripheral area LA, the overcoat layer TIL3 may be located on the encapsulation layer ENC included in the display panel DP, for example on the second encapsulation inorganic layer EIL2.

The overcoat layer TIL3 may extend from the display area DA to the peripheral area LA. The overcoat layer TIL3 may overlap the entire peripheral area LA, and may extend to form an inner surface of the through-hole DTA. The overcoat layer TIL3 may overlap the depression pattern GV located in the peripheral area LA. For example, the overcoat layer TIL3 may fill the second depression pattern GV2. The overcoat layer TIL3 may be located directly on the encapsulation layer ENC in the peripheral area LA, and may contact the second encapsulation inorganic layer EIL2.

The overcoat layer TIL3 may entirely provide flat upper surfaces in the display area DA and the peripheral area LA. The upper surface of the overcoat layer TIL3 located in the display area DA and the upper surface of the overcoat layer TIL3 located in the peripheral area LA may substantially form the same surface. A maximum distance from the substrate SUB to the upper surface of the overcoat layer TIL3 located in the display area DA, and a maximum distance from the substrate SUB to the upper surface of the overcoat layer TIL3 located in the peripheral area LA may be substantially the same.

The cover layer TIL4 may be located on the flat upper surface of the overcoat layer TIL3. The cover layer TIL4 may extend from the display area DA to the peripheral area LA. The cover layer TIL4 may overlap the entire peripheral area LA, and may extend to form an inner surface of the through-hole DTA.

The overcoat layer TIL3 and the cover layer TIL4 that overlap the peripheral area LA may be included. The display device according to some embodiments includes the overcoat layer TIL3 and the cover layer TIL4 extending from the display area DA. Accordingly, a separate constituent element for providing a flat surface on the encapsulation layer ENC having a step may not be included. It is therefore possible to provide a display device with a simplified process.

Hereinafter, a display device according to some embodiments will be described with reference to FIG. 6 to FIG. 11. FIG. 6, FIG. 7, FIG. 8, FIG. 9, FIG. 10, and FIG. 11 respectively illustrate a cross-sectional view of a hole area HA according to some embodiments. A repeated description of the same constituent elements as described above will be omitted.

Figure 6:
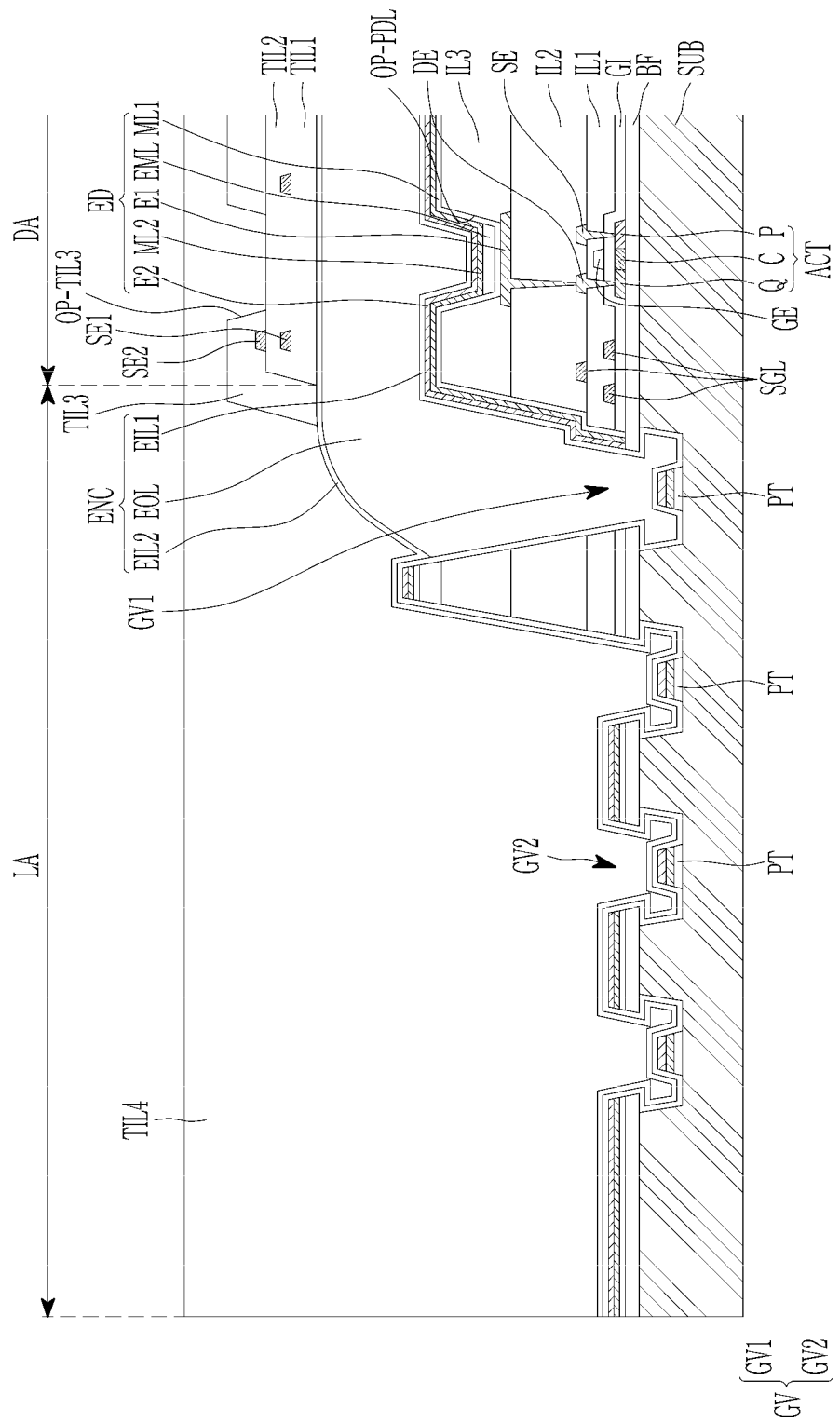
FIG. 6, FIG. 7, FIG. 8, FIG. 9, FIG. 10, and FIG. 11 respectively illustrate a cross-sectional view of a hole area of a display device.

First, referring to FIG. 6, the display device according to some embodiments includes the first touch insulating layer TIL1, the second touch insulating layer TIL2, the touch electrodes SE1 and SE2, the overcoat layer TIL3, and the cover layer TIL4 that are located on the encapsulation layer ENC.

The overcoat layer TIL3 according to some embodiments may overlap the display area DA. The overcoat layer TIL3 might not overlap the peripheral area LA, or may overlap a portion of an edge of the peripheral area LA.

The cover layer TIL4 may be located on the overcoat layer TIL3. The cover layer TIL4 may extend from the display area DA to the peripheral area LA. The cover layer TIL4 may overlap the depression pattern GV located in the peripheral area LA. For example, the cover layer TIL4 may fill the second depression pattern GV2. The cover layer TIL4 may be located directly on the encapsulation layer ENC in the peripheral area LA, and may contact the second encapsulation inorganic layer EIL2.

A maximum thickness of the cover layer TIL4 overlapping the peripheral area LA may be larger than that of the cover layer TIL4 overlapping the display area DA. An upper surface of the cover layer TIL4 overlapping the peripheral area LA and an upper surface of the cover layer TIL4 overlapping the display area DA may substantially form the same surface. The cover layer TIL4 may entirely provide a flat upper surface on the display area DA and the peripheral area LA.

The display device according to some embodiments includes the cover layer TIL4 extending from the display area DA to the peripheral area LA. Accordingly, a separate constituent element for providing a flat surface on the encapsulation layer ENC having a step may be omitted. It is therefore possible to provide a display device with a simplified process.

Figure 7:
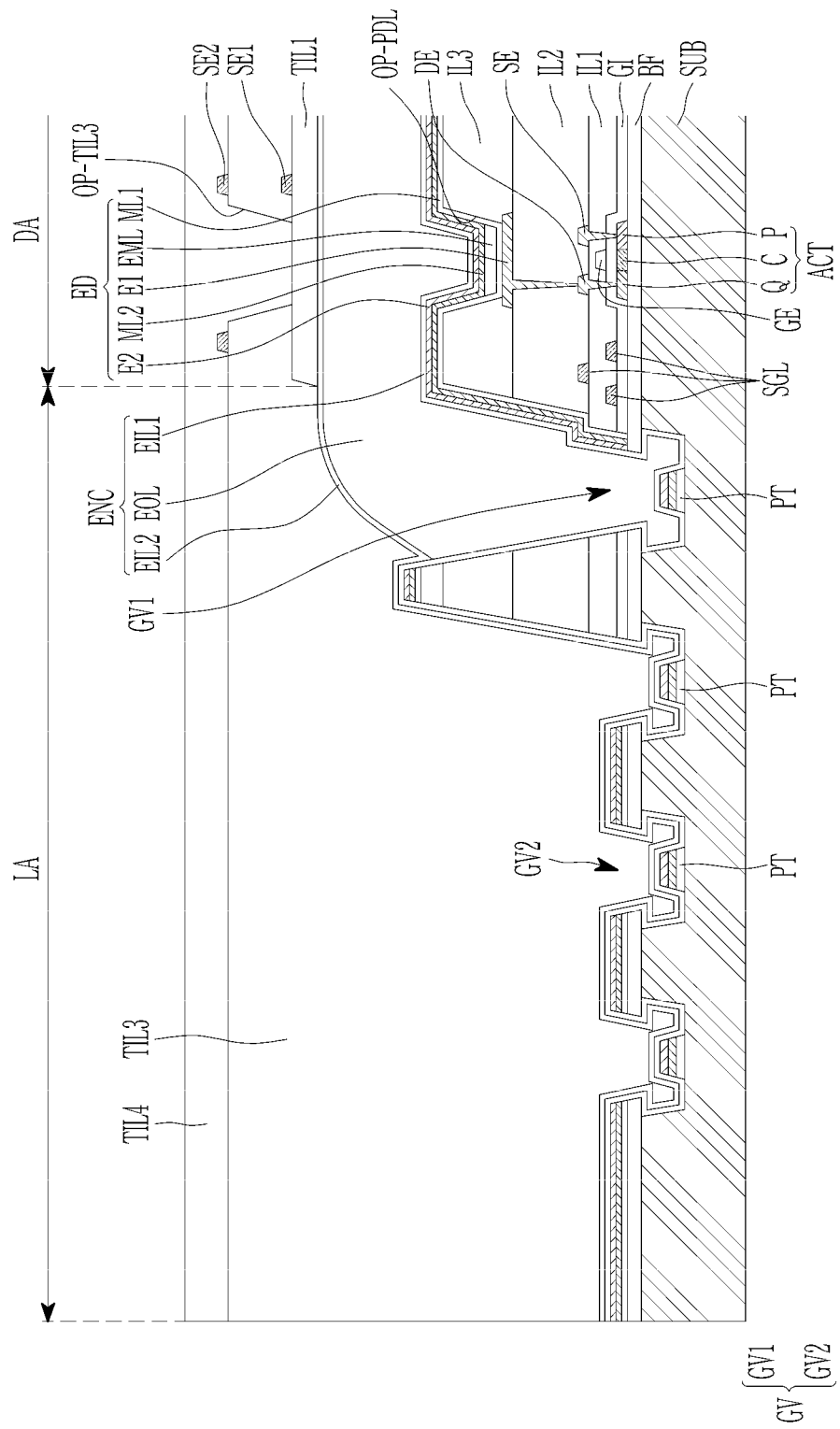

Next, referring to FIG. 7, the display device according to some embodiments includes the first touch insulating layer TIL1, the touch electrodes SE1 and SE2, the overcoat layer TIL3, and the cover layer TIL4 that are located on the encapsulation layer ENC. Compared with some embodiments of FIG. 5B, the second touch insulating layer TIL2 may be omitted.

One portion SE1 of the touch electrode may be located between the first touch insulating layer TIL1 and the overcoat layer TIL3. In addition, the other portion SE2 of the touch electrode may be located between the overcoat layer TIL3 and the cover layer TIL4.

The overcoat layer TIL3 may be located directly on the first touch insulating layer TIL1. The overcoat layer TIL3 may cover one portion SE1 of the touch electrode.

The display device according to some embodiments includes the overcoat layer TIL3 and the cover layer TIL4 extending from the display area DA. Accordingly, a separate constituent element for providing a flat upper surface on the encapsulation layer ENC having a step may not be included. In addition, because the display device according to some embodiments does not include the second touch insulating layer TIL2 compared to some embodiments shown in FIG. 5B, the display device may be provided in a more simplified process.

Figure 8:
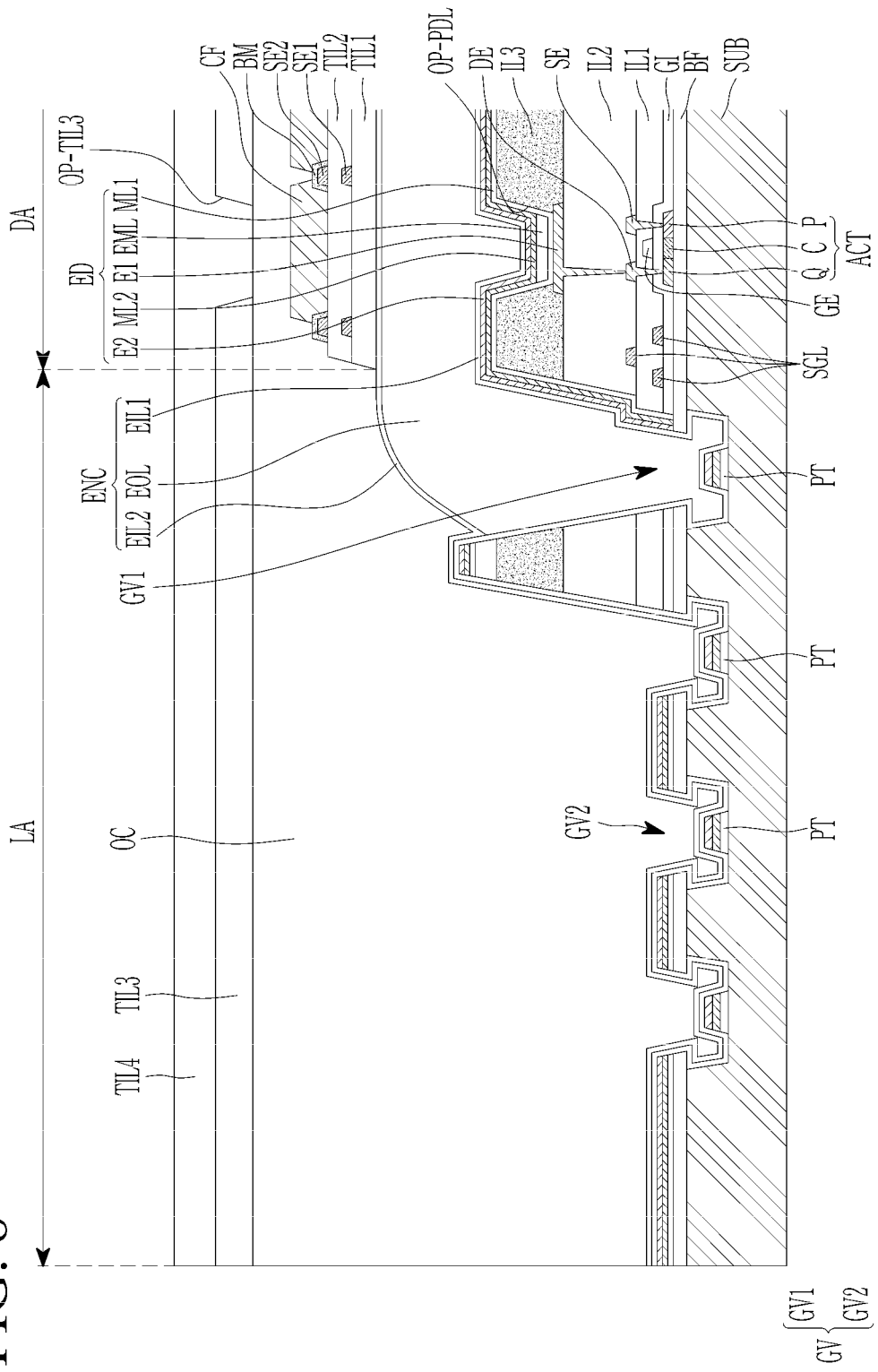

Next, referring to FIG. 8, the display device according to some embodiments may include the first touch insulating layer TIL1, the second touch insulating layer TIL2, the touch electrode SE1 and SE2, a light blocking pattern BM, a color filter CF, a second overcoat layer OC, the first overcoat layer TIL3, and the cover layer TIL4.

The first touch insulating layer TIL1 may be located on the encapsulation layer ENC included in the display panel DP. The first touch insulating layer TIL1 may overlap the display area DA, and may overlap or be spaced apart from a portion of the edge of the peripheral area LA.

One portion SE1 of the touch electrode may be located on the first touch insulating layer TIL1. The second touch insulating layer TIL2 may be located on the first touch insulating layer TIL1 and one portion SE1 of the touch electrode. The second touch insulating layer TIL2 may overlap the display area DA, and may overlap or be spaced apart from a portion of the edge of the peripheral area LA. The other portion SE2 of the touch electrode may be located on the second touch insulating layer TIL2.

The light blocking pattern BM may be located on the other portion SE2 of the touch electrode. The light blocking pattern BM may reduce reflection of external light and improve the reflected color. The light blocking pattern BM may overlap the pixel defining layer IL3 along a thickness direction thereof. The light blocking pattern BM may have a lattice shape in a plan view. The light blocking pattern BM, the touch electrode SE, and the pixel defining layer IL3 are all located in a non-emission area, and may overlap each other along the thickness direction thereof. A width of the light blocking pattern BM may be less than or equal to that of the pixel defining layer IL3, and may be larger than that of the touch electrode SE. The light blocking pattern BM might not overlap the emission layer EML.

The color filter CF may be located on one or more adjacent portions of the light blocking pattern BM. An arrangement of the color filters CF may be determined in consideration of light emitted from the light emitting element included in the display panel DP. The color filter CF may overlap the emission layer EML.

The second overcoat layer OC may be located on the light blocking pattern BM and the color filter CF. The second overcoat layer OC may be located directly on the light blocking pattern BM and the color filter CF. The second overcoat layer OC may cover and protect the light blocking pattern BM and the color filter CF. In some embodiments, the second overcoat layer OC may flatten a surface.

The second overcoat layer OC may extend up to the peripheral area LA while overlapping the display area DA. A thickness of the second overcoat layer OC overlapping the display area DA may be less than that of the second overcoat layer OC overlapping the peripheral area LA. The second overcoat layer OC may provide a flat upper surface while filling the peripheral area LA. That is, the second overcoat layer OC overlapping the display area DA and the second overcoat layer OC overlapping the peripheral area LA may have an upper surface forming the same surface.

The second overcoat layer OC may be located directly on, and may contact, the second encapsulation inorganic layer EIL2. The second overcoat layer OC may overlap the depression pattern GV located in the peripheral area LA. For example, the second overcoat layer OC may fill the second depression pattern GV2. According to some embodiments, it is possible to provide a display device with a simplified stacked structure and simplified process while the second overcoat layer OC fills the peripheral area LA.

The first overcoat layer TIL3 and the cover layer TIL4 may be located on the second overcoat layer OC. The first overcoat layer TIL3 may have the first opening OP-TIL3. The first opening OP-TIL3 means a portion that is not covered by the first overcoat layer TIL3. The first opening OP-TIL3 may overlap the pixel opening OP-PDL.

The cover layer TIL4 may be located on the first overcoat layer TIL3. The cover layer TIL4 may have a shape overlapping the front surface of the substrate SUB. The cover layer TIL4 may be located within the first opening OP-TIL3 of the first overcoat layer TIL3. The first overcoat layer TIL3 and the cover layer TIL4 may have a shape extending from the display area DA to the peripheral area LA.

Meanwhile, the pixel defining layer IL3 according to some embodiments may include a black pigment, which may also be applied to embodiments of FIG. 9, FIG. 10, and FIG. 11 to be described later. The black pigment according to some embodiments may include black pigment particles that absorb external light, and a dispersant bonded to the black pigment particles, but is not limited thereto, and may include only black pigment particles wherein the dispersant is omitted.

The pixel defining layer IL3 may absorb external light, or may reduce or prevent light leakage. The pixel defining layer IL3 according to some embodiments may overlap the aforementioned light blocking pattern BM. The pixel defining layer IL3 may reduce a phenomenon in which external light is reflected on a metal wire such as a gate line or a data line and is viewed due to light leakage, thereby increasing display quality of a display device.

Figure 9:
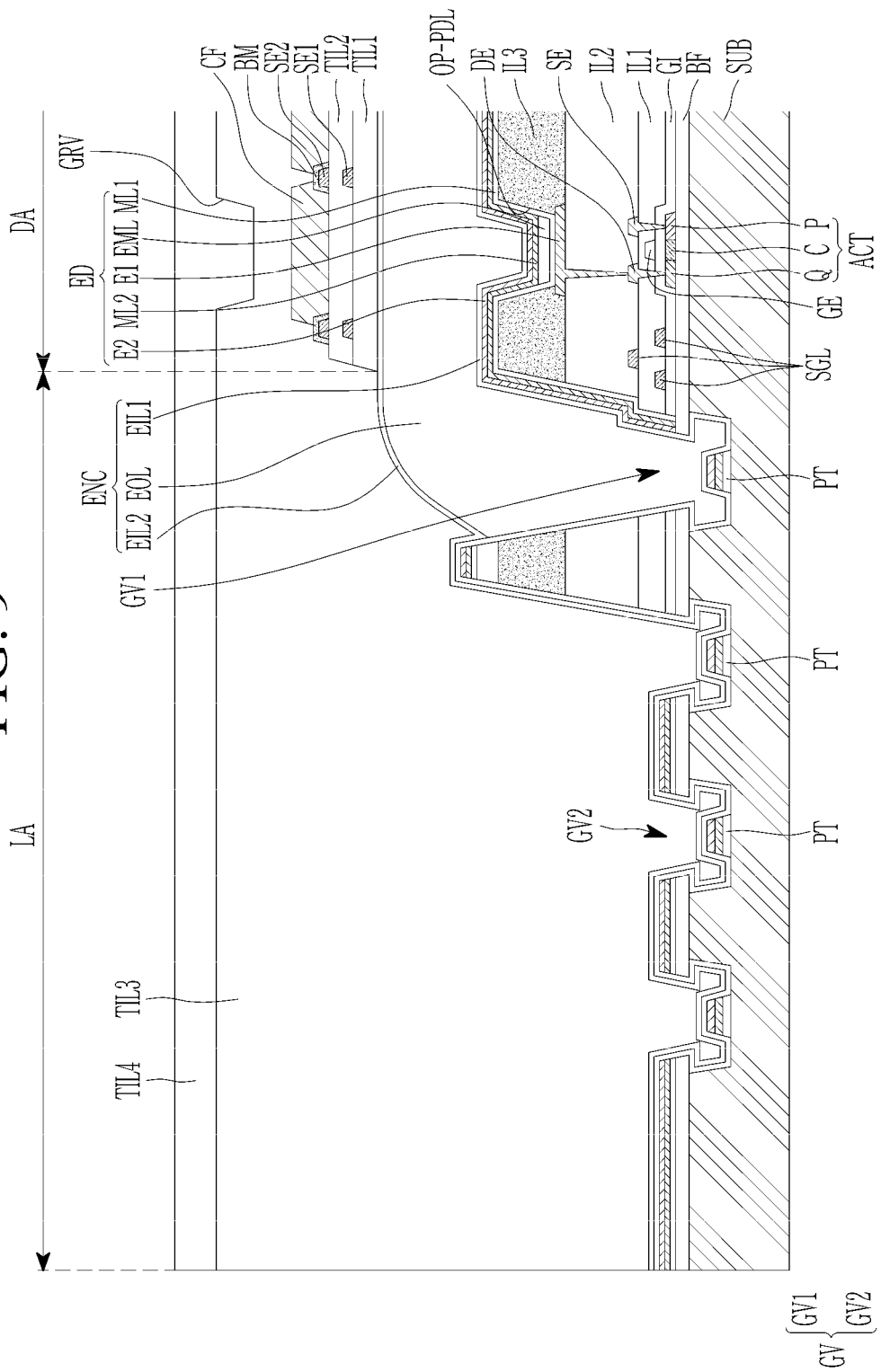

Next, referring to FIG. 9, the display device according to some embodiments may include the first overcoat layer TIL3 located on the color filter CF and the light blocking pattern BM. The first overcoat layer TIL3 may be located directly on the color filter CF, and may contact the color filter CF and the light blocking pattern BM.

The first overcoat layer TIL3 may extend from the display area DA to the peripheral area LA. The first overcoat layer TIL3 may overlap the display area DA and the peripheral area LA, and may form an inner surface of the through-hole DTA. The upper surface of the first overcoat layer TIL3 located in the display area DA and the upper surface of the first overcoat layer TIL3 located in the peripheral area LA may have substantially the same height from the substrate SUB.

The first overcoat layer TIL3 may overlap the depression pattern GV located in the peripheral area LA. For example, the first overcoat layer TIL3 may fill the second depression pattern GV. The first overcoat layer TIL3 may contact the second encapsulated inorganic layer EIL2 in the peripheral area LA. The first overcoat layer TIL3 may be located directly on the second encapsulated inorganic layer EIL2 in the peripheral area LA.

The first overcoat layer TIL3 may include a groove GRV overlapping the emission layer EML. A thickness of the first overcoat layer TIL3 in which the groove GRV is located in the display area DA may be less than that of the first overcoat layer TIL3 in which the groove GRV is not located. The first overcoat layer TIL3 including the groove GRV may be formed by using a halftone mask. The groove GRV may overlap the pixel opening OP-PDL.

The cover layer TIL4 may be located on the first overcoat layer TIL3. The cover layer TIL4 may have a shape overlapping the front surface of the substrate SUB. The cover layer TIL4 may extend from the display area DA to the peripheral area LA. The cover layer TIL4 may fill the groove GRV of the first overcoat layer TIL3. A portion of the cover layer TIL4 may be located in the groove GRV of the first overcoat layer TIL3.

The display device according to some embodiments includes the first overcoat layer TIL3 including the groove GRV and the cover layer TIL4 located in the groove GRV, thereby improving front visibility and light emission efficiency of the display device. At least a portion of the light generated by the light emitting element ED is totally reflected by an interface between the first overcoat layer TIL3 and the cover layer TIL4, so that the light may be condensed in the front.

In addition, according to some embodiments, because the first overcoat layer TIL3 fills the peripheral area LA, a display device with a simplified process may be provided.

Figure 10:
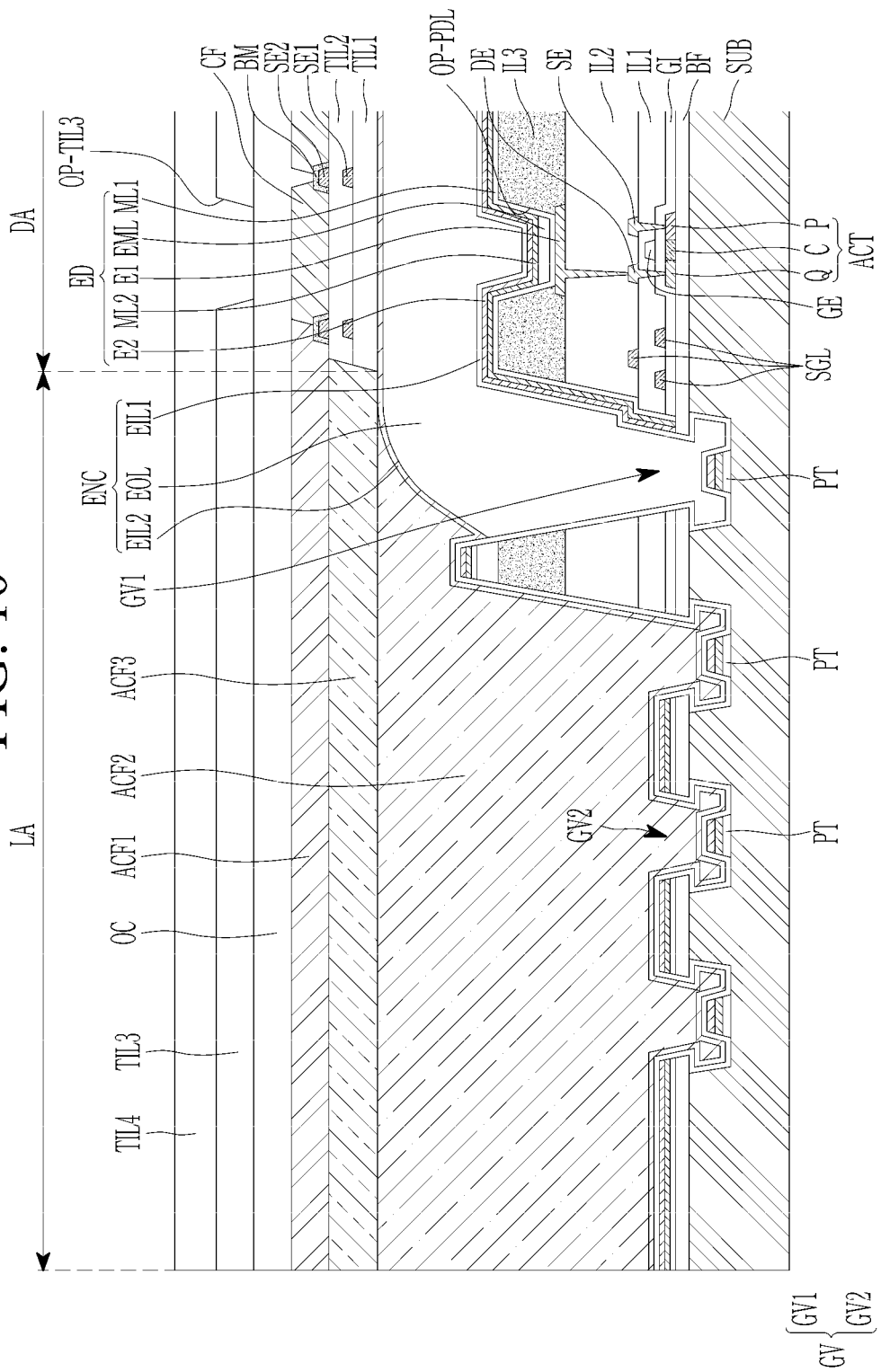

Next, referring to FIG. 10, a first auxiliary color filter ACF1, a second auxiliary color filter ACF2, and a third auxiliary color filter ACF3 may be located in the peripheral area LA according to some embodiments. The first auxiliary color filter ACF1 may be formed in the same process as the first color filter located in the display area DA. The second auxiliary color filter ACF2 may be formed in the same process as the second color filter located in the display area DA. The third auxiliary color filter ACF3 may be formed in the same process as the third color filter located in the display area DA.

In the peripheral area LA, the second auxiliary color filter ACF2, the third auxiliary color filter ACF3, and the first auxiliary color filter ACF1 may be sequentially stacked in this order. The first auxiliary color filter ACF1 may be a portion of the red color filter, the second auxiliary color filter ACF2 may be a portion of the green color filter, and the third auxiliary color filter ACF3 may be a portion of the blue color filter.

The auxiliary color filters stacked in an order of green, blue, and red may be located in the peripheral area LA, and the auxiliary color filters may function as a light blocking pattern. In addition, when the auxiliary color filters are stacked in the order of green, blue, and red, a reflective color characteristic may be further improved.

According to some embodiments, the second auxiliary color filter ACF2 may fill the second depression pattern GV2. The second auxiliary color filter ACF2 may be located directly on the encapsulation layer ENC in the peripheral area LA, and may contact it. An upper surface of the second auxiliary color filter ACF2 may be provided to be flat.

The second overcoat layer OC, the first overcoat layer TIL3, and the cover layer TIL4 that extend from the display area DA may be located on the first auxiliary color filter ACF1.

According to some embodiments, a display device with a simplified process may be provided while the auxiliary color filter formed in the same process as the color filter fills the peripheral area LA. In addition, as a plurality of auxiliary color filters having different colors overlap each other in the peripheral area LA, a separate light blocking layer on the cover window may be omitted.

Figure 11:
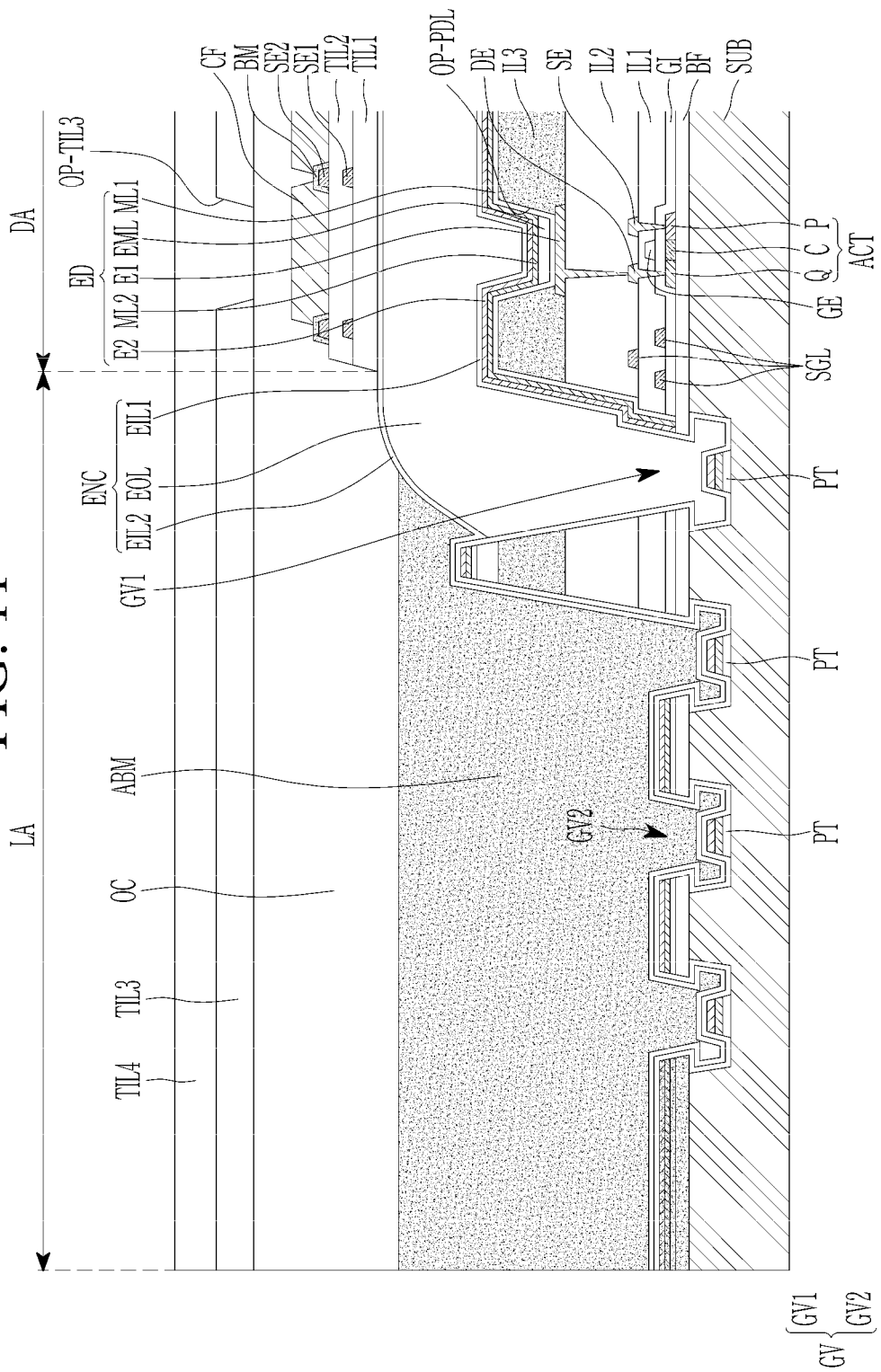

Next, referring to FIG. 11, an auxiliary light blocking pattern ABM may be located in the peripheral area LA according to some embodiments. The auxiliary light blocking pattern ABM may be formed in the same process as the light blocking pattern BM located in the display area DA. However, unlike the light blocking pattern BM, the auxiliary light blocking pattern ABM may be formed to be relatively thick.

The second overcoat layer OC, the first overcoat layer TIL3, and the cover layer TIL4 that extend from the display area DA may be located on the auxiliary light blocking pattern ABM. The second overcoat layer OC may provide a flat upper surface on the display area DA and the peripheral area LA while covering the color filter CF and the light blocking pattern BM. The second overcoat layer TIL3 having the first opening OP-TIL3 may be located on the second overcoat layer OC. The cover layer TIL4 may fill the first opening OP-TIL3.

According to some embodiments, a display device with a simplified process may be provided while the auxiliary light blocking pattern formed in the same process as the light blocking pattern fills the peripheral area LA.

Figure 12:
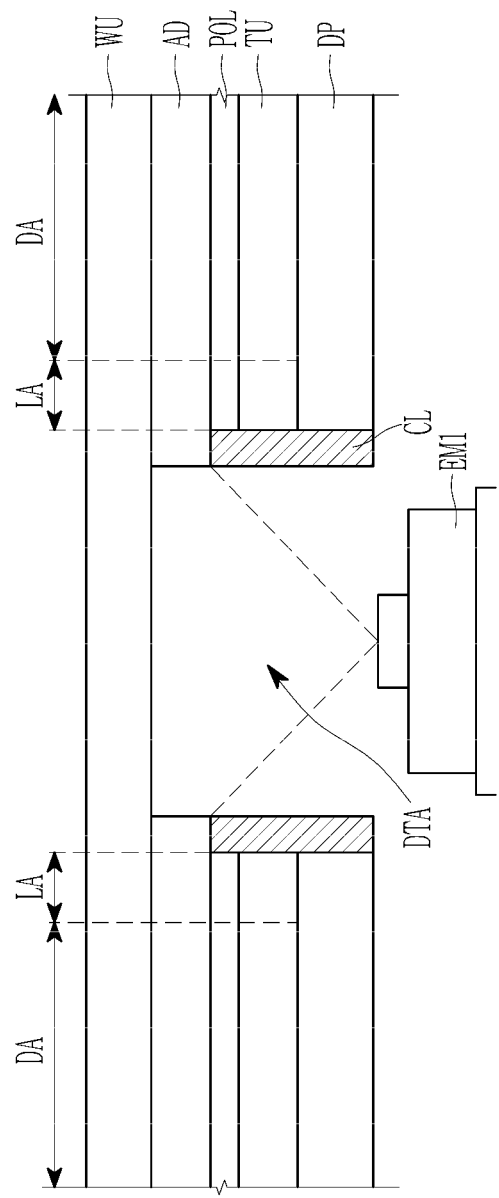
FIG. 12 illustrates a schematic cross-sectional view of a display device according to some embodiments.

Hereinafter, a display device according to some embodiments will be described with reference to FIG. 12. FIG. 12 illustrates a schematic cross-sectional view of a display device according to some embodiments.

Referring to FIG. 12, the display device according to some embodiments may further include an anti-reflection member POL located on the display panel DP and the touch sensing part TU that are described above. The anti-reflection member POL may polarize light passing through. In addition, the anti-reflection member POL may serve to reduce reflection of external light. The anti-reflection member POL may be bonded to the touch sensing part TU through a separate adhesive layer, or may be formed directly on the touch sensing part TU.

A coating film CL may be located on an inner wall of the through-hole DTA. The coating film CL may cover both the display panel DP and the touch sensing part TU to form at least a portion of an inner surface of the through-hole DTA. For example, the coating film CL may be made of a resin having water resistance and chemical resistance. The coating film CL may block penetration of moisture or foreign particles to improve reliability of the display panel DP and the touch detection part TU. Alternatively, the coating film CL may include a black-based resin including a black dye or black pigment. When the coating film CL includes the black-based resin, light leakage from the through-hole DTA may be reduced or prevented.

The display device according to some embodiments may further include the cover window WU. The cover window WU may cover the display panel DP to protect it. The cover window WU may be attached on one surface of the anti-reflection member POL through the adhesive layer AD located between the anti-reflection member POL and the cover window WU.

According to the above-described embodiments of FIG. 10 and FIG. 11, as a plurality of auxiliary color filters are overlapped, or as the auxiliary light blocking patterns are located, the peripheral area LA adjacent to the through-hole DTA might not require a separate light blocking pattern between the cover window WU and the adhesive layer AD. By omitting the light blocking pattern, a display device manufactured through a simplified process may be provided. In addition, it is possible to provide a display device with an excellent angle of view of light supplied from the first electronic module EM1.

While embodiments have been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims, with functional equivalents thereof to be included therein.

DESCRIPTION OF SYMBOLS

DP: display panel
TU: touch sensing part
DTA: opening area
LA: peripheral area
DA: display area
SUB: substrate
ED: light emitting element
ENC: encapsulation layer
TIL1: first touch insulating layer
TIL2: second touch insulating layer
TIL3: overcoat layer, first overcoat layer
TIL4: cover layer
GV: depression pattern
OC: second overcoat layer
BM: light blocking pattern
CF: color filter

What is claimed is:

1. A display device comprising:
   a substrate having an opening area, a peripheral area surrounding the opening area, and a display area surrounding the peripheral area;
   a transistor and a light emitting element on the substrate;
   an encapsulation layer on the light emitting element;
   a first touch insulating layer on the encapsulation layer;
   an overcoat layer on the first touch insulating layer, and defining a first opening;
   a cover layer filling the first opening; and
   a first portion of a touch electrode directly contacting the first touch insulating layer to be directly on the first touch insulating layer,
   wherein at least one of the overcoat layer and the cover layer extends from the display area to the peripheral area,
   wherein the substrate comprises a depression pattern that is filled by the overcoat layer or the cover layer.

2. The display device of claim 1, wherein the overcoat layer extends from the display area to the peripheral area, and contacts the encapsulation layer in the peripheral area.

3. The display device of claim 1, wherein the overcoat layer at least partially fills the depression pattern.

4. The display device of claim 1, wherein the display device further comprises a second touch insulating layer between the first touch insulating layer and the overcoat layer.

5. The display device of claim 4, wherein the first touch insulating layer and the second touch insulating layer overlap the display area, and are spaced apart from the peripheral area.

6. A display device comprising:
   a substrate having an opening area, a peripheral area surrounding the opening area, and a display area surrounding the peripheral area, and defining a depression pattern at the peripheral area;
   a transistor and a light emitting element on the substrate;
   an encapsulation layer on the light emitting element;
   a touch insulating layer on the encapsulation layer;
   a light blocking pattern and a color filter on the touch insulating layer;
   a first overcoat layer on the color filter; and
   a cover layer on the first overcoat layer,
   wherein at least one of the light blocking pattern, the color filter, the first overcoat layer, or the cover layer overlaps the depression pattern, and
   wherein the first overcoat layer is directly on the color filter, and extends from the display area to the peripheral area.

7. A display device comprising:
   a substrate having an opening area, a peripheral area surrounding the opening area, and a display area surrounding the peripheral area, and defining a depression pattern at the peripheral area;

a transistor and a light emitting element on the substrate;
an encapsulation layer on the light emitting element;
a touch insulating layer on the encapsulation layer;
a light blocking pattern and a color filter on the touch insulating layer;
a first overcoat layer on the color filter; and
a cover layer on the first overcoat layer,
wherein at least one of the light blocking pattern, the color filter, the first overcoat layer, or the cover layer overlaps the depression pattern,
wherein the display device further comprises a second overcoat layer between the color filter and the first overcoat layer, and
wherein the second overcoat layer extends from the display area to the peripheral area, and contacts the encapsulation layer in the peripheral area.

8. The display device of claim 7, wherein the second overcoat layer at least partially fills the depression pattern.

9. The display device of claim 6, wherein the first overcoat layer at least partially fills the depression pattern.

10. The display device of claim 6, wherein the first overcoat layer defines a groove overlapping the display area, and
wherein the cover layer at least partially fills the groove.

11. The display device of claim 6, wherein a thickness of a portion of the first overcoat layer overlapping the color filter in the display area is less than a thickness of a portion of the first overcoat layer overlapping the light blocking pattern.

12. The display device of claim 6, wherein the display device comprises a first auxiliary color filter, a second auxiliary color filter, and a third auxiliary color filter at the peripheral area, and overlapping each other along a thickness direction thereof.

13. The display device of claim 12, wherein the first auxiliary color filter comprises red color filter,
wherein the second auxiliary color filter comprises green color filter,
wherein the third auxiliary color filter comprises blue color filter, and
wherein the second auxiliary color filter, the third auxiliary color filter, and the first auxiliary color filter are sequentially stacked at the peripheral area.

14. The display device of claim 12, further comprising a second overcoat layer between the color filter and the first overcoat layer.

15. The display device of claim 12, wherein one of the first auxiliary color filter, the second auxiliary color filter, and the third auxiliary color filter at least partially fills the depression pattern.

16. The display device of claim 6, further comprising an auxiliary light blocking pattern at the peripheral area.

17. The display device of claim 16, wherein the auxiliary light blocking pattern at least partially fills the depression pattern.

18. The display device of claim 12, wherein the display device further comprises an adhesive layer and a cover window that are-on the cover layer.

19. The display device of claim 1, wherein the touch electrode comprises a sensing electrode, a driving electrode, and a bridge electrode, and
wherein the first portion of the touch electrode comprises the bridge electrode.

20. The display device of claim 19, further comprising another driving electrode,
wherein the driving electrode is adjacent to the another driving electrode, and is electrically connected to the another driving electrode through the bridge electrode.

* * * * *